United States Patent
Shimoju et al.

(10) Patent No.: US 11,441,053 B2
(45) Date of Patent: *Sep. 13, 2022

(54) COMPOSITION FOR FORMING ADHESIVE FILM FOR IMPRINTING, ADHESIVE FILM, LAMINATE, METHOD FOR PRODUCING CURED PRODUCT PATTERN, AND METHOD FOR MANUFACTURING CIRCUIT SUBSTRATE

(71) Applicant: FUJIFILM Corporation, Tokyo (JP)

(72) Inventors: Naoya Shimoju, Haibara-gun (JP); Akinori Shibuya, Haibara-gun (JP); Yuichiro Goto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 312 days.

This patent is subject to a terminal disclaimer.

(21) Appl. No.: 16/546,996

(22) Filed: Aug. 21, 2019

(65) Prior Publication Data

US 2019/0382623 A1 Dec. 19, 2019

Related U.S. Application Data

(63) Continuation of application No. PCT/JP2018/007122, filed on Feb. 27, 2018.

(30) Foreign Application Priority Data

Feb. 28, 2017 (JP) .............................. JP2017-036863

(51) Int. Cl.
| | | |
|---|---|---|
| *C09J 7/30* | (2018.01) | |
| *C09J 5/00* | (2006.01) | |
| *C09J 133/14* | (2006.01) | |
| *C09J 133/04* | (2006.01) | |
| *C08L 33/14* | (2006.01) | |
| *C08L 33/04* | (2006.01) | |
| *B32B 3/26* | (2006.01) | |
| *B32B 7/12* | (2006.01) | |
| *B32B 9/00* | (2006.01) | |
| *B32B 9/04* | (2006.01) | |
| *B32B 27/30* | (2006.01) | |
| *B32B 37/12* | (2006.01) | |
| *B32B 37/15* | (2006.01) | |
| *B32B 38/00* | (2006.01) | |
| *H01L 21/027* | (2006.01) | |
| *B29C 59/02* | (2006.01) | |
| *B29K 105/00* | (2006.01) | |
| *G03F 7/00* | (2006.01) | |

(52) U.S. Cl.
CPC ............... *C09J 7/30* (2018.01); *B32B 3/263* (2013.01); *B32B 7/12* (2013.01); *B32B 9/005* (2013.01); *B32B 9/045* (2013.01); *B32B 27/308* (2013.01); *B32B 37/1207* (2013.01); *B32B 37/15* (2013.01); *B32B 38/0008* (2013.01); *C08L 33/04* (2013.01); *C08L 33/14* (2013.01); *C09J 5/00* (2013.01); *C09J 133/04* (2013.01); *C09J 133/14* (2013.01); *H01L 21/0271* (2013.01); *B29C 59/02* (2013.01); *B29K 2105/0097* (2013.01); *B32B 2250/02* (2013.01); *B32B 2255/26* (2013.01); *B32B 2305/72* (2013.01); *B32B 2310/0806* (2013.01); *B32B 2315/02* (2013.01); *B32B 2333/08* (2013.01); *B32B 2457/08* (2013.01); *C09J 2203/326* (2013.01); *C09J 2301/416* (2020.08); *C09J 2301/502* (2020.08); *C09J 2433/00* (2013.01); *G03F 7/0002* (2013.01)

(58) Field of Classification Search
CPC ..................................... C09J 7/30; C08L 33/04
See application file for complete search history.

(56) References Cited

U.S. PATENT DOCUMENTS

| | | |
|---|---|---|
| 2007/0017631 A1 | 1/2007 | Xu |
| 2007/0264601 A1 | 11/2007 | Uematsu et al. |
| 2009/0155583 A1 | 6/2009 | Xu et al. |
| 2013/0270741 A1 | 10/2013 | Ookawa et al. |
| 2014/0151733 A1 | 6/2014 | Koike et al. |
| 2014/0216538 A1 | 8/2014 | Kato et al. |
| 2015/0014819 A1 | 1/2015 | Hattori et al. |
| 2015/0079793 A1 | 3/2015 | Hattori et al. |

(Continued)

FOREIGN PATENT DOCUMENTS

| | | |
|---|---|---|
| CN | 101044434 A | 9/2007 |
| CN | 103503115 A | 1/2014 |

(Continued)

OTHER PUBLICATIONS

Office Action dated Apr. 21, 2021 by the Taiwanese Patent Office in Taiwanese application No. 107106533.

(Continued)

*Primary Examiner* — Wenwen Cai
(74) *Attorney, Agent, or Firm* — Sughrue Mion, PLLC

(57) ABSTRACT

There are provided a composition for forming an adhesive film for imprinting having excellent adhesiveness and wettability, an adhesive film, a laminate, a method for producing a cured product pattern, and a method for manufacturing a circuit substrate. A composition for forming an adhesive film for imprinting contains a resin having a polymerizable group; and a solvent, in which the resin has at least one kind of a repeating unit derived from a polymerizable compound having a C log P value less than or equal to 0, and solubility of the resin in water at 25° C. is greater than or equal to 1 mass %, provided that the C log P value is a coefficient showing affinity of an organic compound with respect to water and 1-octanol.

19 Claims, 2 Drawing Sheets

(56) References Cited

U.S. PATENT DOCUMENTS

| | | | |
|---|---|---|---|
| 2015/0079804 A1 | 3/2015 | Kitagawa et al. | |
| 2016/0068674 A1 | 3/2016 | Kobayashi et al. | |
| 2017/0184959 A1 | 6/2017 | Honma et al. | |

FOREIGN PATENT DOCUMENTS

| | | | |
|---|---|---|---|
| JP | 2009-503139 A | 1/2009 | |
| JP | 2010-097202 A | 4/2010 | |
| JP | 2011-508680 A | 3/2011 | |
| JP | 2012-086484 A | 5/2012 | |
| JP | 2013-153084 A | 8/2013 | |
| JP | 2013-202982 A | 10/2013 | |
| JP | 2014-003123 A | 1/2014 | |
| JP | 2014-024322 A | 2/2014 | |
| JP | 2016-028419 A | 2/2016 | |
| TW | 201327631 A1 | 7/2013 | |
| TW | 201403220 A | 1/2014 | |
| TW | 201500383 A | 1/2015 | |

OTHER PUBLICATIONS

International Search Report dated May 15, 2018, issued by the International Searching Authority in corresponding application No. PCT/JP2018/007122.

Written Opinion dated May 15, 2018, issued by the International Searching Authority in corresponding application No. PCT/JP2018/007122.

International Preliminary Report on Patentability dated Sep. 3, 2019, issued by the International Bureau in corresponding application No. PCT/JP2018/007122.

COMPOSITION FOR FORMING ADHESIVE FILM FOR IMPRINTING, ADHESIVE FILM, LAMINATE, METHOD FOR PRODUCING CURED PRODUCT PATTERN, AND METHOD FOR MANUFACTURING CIRCUIT SUBSTRATE

CROSS-REFERENCE TO RELATED APPLICATIONS

This application is a Continuation of PCT International Application No. PCT/JP2018/007122 filed on Feb. 27, 2018, which claims priority under 35 U.S.C § 119(a) to Japanese Patent Application No. 2017-036863 filed on Feb. 28, 2017. Each of the above application(s) is hereby expressly incorporated by reference, in its entirety, into the present application.

BACKGROUND OF THE INVENTION

1. Field of the Invention

The present invention relates to a composition for forming an adhesive film for imprinting, an adhesive film, a laminate, a method for producing a cured product pattern, and a method for manufacturing a circuit substrate.

2. Description of the Related Art

An imprinting method is technology which is obtained by developing embossing technology well known for manufacturing an optical disk and in which a mold prototype (generally called a mold, a stamper, or a template) on which a concave-convex pattern is formed is pressed against a resist and mechanically deformed, and a fine pattern is precisely transferred. The imprinting method is nano processing technology which is economical since fine structures such as nano structures can be simply repeatedly formed, and in which harmful waste and effluent are little. Therefore, it has recently been expected to be applied to various fields.

In the imprinting method, light is radiated through a light-transmitting mold or a light-transmitting substrate, and a curable composition is photocured, followed by peeling the mold to transfer a fine pattern to a cured product. Since this method enables imprinting at room temperature, it can be applied to a precision processing field of ultrafine patterns such as production of a semiconductor integrated circuit. In recent years, new developments such as a nanocasting method in which advantages of both methods are combined or a reversal imprinting method in which a three-dimensional lamination structure is produced have been reported.

In such an imprint method, a formed pattern is used as a mask and is used for processing a substrate through a method such as etching. This technology can be used for manufacturing high density semiconductor integrated circuit, manufacturing a transistor of a liquid crystal display, processing a magnetic body of a next-generation hard disk called patterned media, and the like through high-accuracy alignment and high integration instead of lithography technology in the related art. Attempts to commercialize the imprinting method relating to these applications have been activated in recent years.

On the other hand, adhesiveness between a substrate and a curable composition for imprinting accompanied by activation of the imprinting method has become a problem. That is, in the imprinting method, a surface of the substrate is coated with the curable composition for imprinting which is then irradiated with light in a state in which the surface thereof is brought into contact with the mold and hardened, and the mold is peeled off. However, in the step of peeling off the mold, the cured product may be peeled off from the substrate and attached to the mold in some cases. It is considered that this is because adhesiveness between the substrate and the cured product is lower than that between the mold and the cured product. It has been studied that an adhesive film for imprinting which improves the adhesiveness between the substrate and the cured product is used (JP2014-024322A and JP2011-508680A) in order to solve such a problem.

SUMMARY OF THE INVENTION

Here, in recent years, not only the adhesiveness between the substrate and the cured product (cured product pattern) but also the filling properties of a curable composition for imprinting to be provided on the surface of an adhesive film for imprinting has been required for the adhesive film.

In particular, in a case where the curable composition for imprinting is applied through an inkjet (IJ) method, liquid droplets of a curable composition for imprinting 22 are added dropwise onto a surface of an adhesive film 21 at equal intervals as shown in FIG. 2, for example, the above-described liquid droplets spread on the adhesive film 21 to form a layer-shaped curable composition for imprinting 22. However, in a case where wettability of the curable composition for imprinting is low, in some cases, the curable composition for imprinting may not spread on the adhesive film 21 and a portion where the adhesive film 21 is not filled with the curable composition for imprinting 22 may remain. That is, it is necessary to improve the wettability of the curable composition for imprinting on the adhesive film 21.

The present invention has been made to solve such problems, and an object of the present invention is to provide a composition for forming an adhesive film for imprinting having excellent adhesiveness and wettability, an adhesive film, a laminate, a method for producing a cured product pattern, and a method for manufacturing a circuit substrate.

It has been found that the above-described problems can be solved using a resin having a polymerizable group and a group having high hydrophilicity in a composition for forming an adhesive film for imprinting under the above-described problems. Specifically, the above-described problems have been solved by means <1> and preferably means <2> to <19>.

<1> A composition for forming an adhesive film for imprinting, the composition comprising: a resin having a polymerizable group; and a solvent, in which the resin has at least one kind of a repeating unit derived from a polymerizable compound having a ClogP value less than or equal to 0, and solubility of the resin in water at 25° C. is greater than or equal to 1 mass %, provided that the ClogP value is a coefficient showing affinity of an organic compound with respect to water and 1-octanol.

<2> The composition for forming an adhesive film for imprinting according to <1>, in which the solvent is contained in the composition for forming an adhesive film for imprinting in a proportion of 85.0 to 99.9 mass %.

<3> The composition for forming an adhesive film for imprinting, according to <1> or <2>, in which the polymerizable group is a (meth)acrylic group.

<4> The composition for forming an adhesive film for imprinting according to any one of <1> to <3>, in which the polymerizable compound has an -alkylene group-oxygen atom-structure.

<5> The composition for forming an adhesive film for imprinting according to any one of <1> to <4>, in which the polymerizable compound has at least one of an anion structure and a cation structure.

<6> The composition for forming an adhesive film for imprinting according to any one of <1> to <5>, in which the polymerizable compound has an amine structure.

<7> The composition for forming an adhesive film for imprinting according to any one of <1> to <6>, further comprising: a non-polymerizable alkylene glycol compound.

<8> The composition for forming an adhesive film for imprinting according to any one of <1> to <7>, in which the solvent contains water.

<9> The composition for forming an adhesive film for imprinting according to any one of <1> to <8>, in which the solvent contains an organic solvent.

<10> The composition for forming an adhesive film for imprinting according to any one of <1> to <9>, in which the resin is a (meth)acrylic resin.

<11> The composition for forming an adhesive film for imprinting according to any one of <1> to <10>, further comprising: at least one of a resin which has a polymerizable group and does not have a repeating unit derived from a polymerizable compound having a ClogP value less than or equal to 0, and a resin which does not have a polymerizable group and has a repeating unit derived from a polymerizable compound having a ClogP value less than or equal to 0.

<12> An adhesive film formed of the composition for forming an adhesive film for imprinting according to any one of <1> to <11>.

<13> The adhesive film according to <12>, in which a critical surface tension of the adhesive film is greater than or equal to 45 mN/m.

<14> A laminate comprising: a substrate; and an adhesive film positioned on a surface of the substrate, in which the adhesive film is the adhesive film according to <12> or <13>.

<15> The laminate according to <14>, in which the adhesive film interacts with the substrate by at least one selected from the group consisting of a covalent bond, an ionic bond, and a hydrogen bond.

<16> The laminate according to <14> or <15>, further comprising: a layer formed of a curable composition for imprinting on a surface of the adhesive film in order of the substrate, the adhesive film, and the layer formed of a curable composition for imprinting.

<17> The laminate according to <14> or <15>, further comprising: a cured product pattern formed of a curable composition for imprinting on a surface of the adhesive film in order of the substrate, the adhesive film, and the cured product pattern.

<18> A method for producing a cured product pattern, the method comprising: an adhesive film formation step of forming an adhesive film by applying the composition for forming an adhesive film for imprinting according to any one of <1> to <11> onto a substrate; an application step of applying a curable composition for imprinting onto a surface of the adhesive film; a mold contact step of bringing the curable composition for imprinting into contact with a mold having a pattern for transferring a pattern shape; a light irradiation step of irradiating the curable composition for imprinting with light to obtain a cured product; and a release step of separating the cured product from the mold.

<19> A method for manufacturing a circuit substrate, the method comprising: a step of obtaining a cured product pattern through the production method according to <18>.

According to the present invention, it has become possible to provide a composition for forming an adhesive film for imprinting capable of providing an adhesive film having excellent adhesiveness between a substrate and a cured product (cured product pattern) and excellent wettability of a curable composition for imprinting, the adhesive film, a laminate, a method for producing a cured product pattern, and a method for manufacturing a circuit substrate.

DESCRIPTION OF THE PREFERRED EMBODIMENTS

Figure 1:
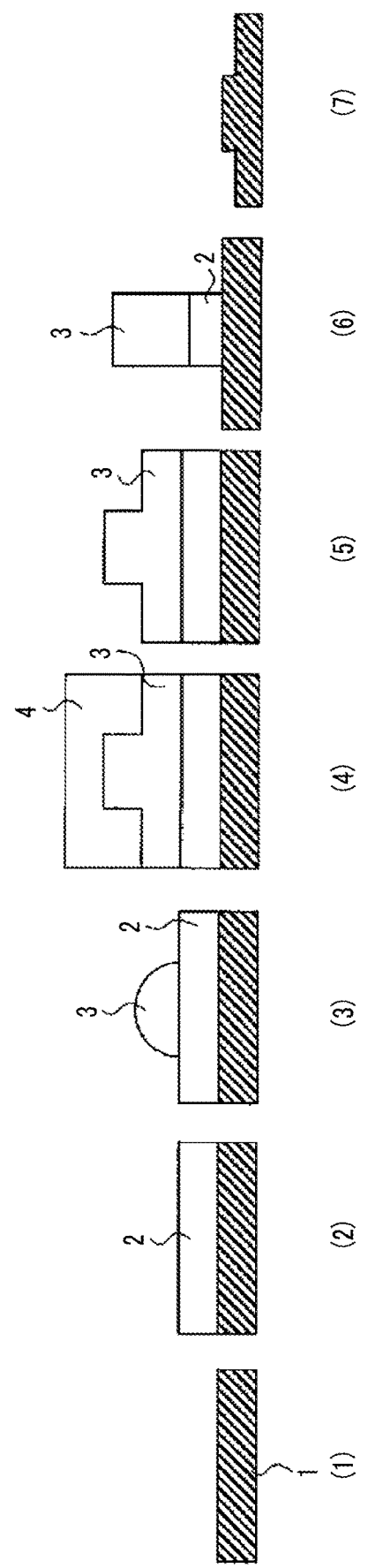
FIG. 1 shows an example of a production process in a case where a cured product pattern is formed and the obtained cured product pattern is used for processing a substrate through etching.
Figure 2:
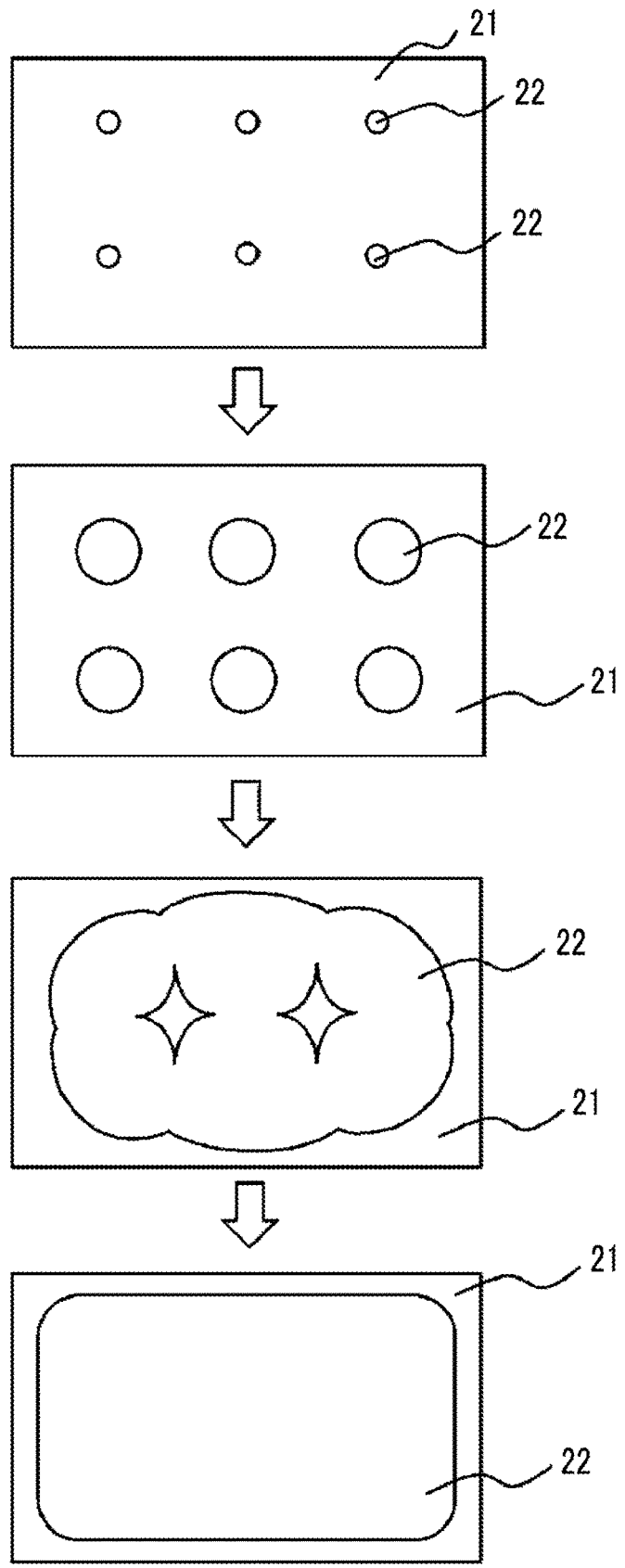
FIG. 2 is a schematic view showing a state of wet-spreading of a curable composition for imprinting in a case where a surface of an adhesive film having low wettability is coated with a curable composition for imprinting through an inkjet method.

Hereinafter, the contents of the present invention will be described in detail. In the present specification, "to" means a range including numerical values denoted before and after "to" as a lower limit value and an upper limit value.

In the present specification, "(meth)acrylate" represents acrylate and methacrylate.

In the present specification, "imprinting" preferably refers to transferring a pattern with a size of 1 nm to 10 mm, and more preferably to transferring (nanoimprinting) a pattern with a size of about 10 nm to 100 μm.

In the notation of a group (atomic group) in the present specification, in a case where it is not described whether the group is substituted or unsubstituted, the group is meant to include and not to include a substituent. For example, an "alkyl group" includes not only an alkyl group having no substituent (unsubstituted alkyl group), but also an alkyl group having a substituent (substituted alkyl group).

In the present specification, "light" includes not only electromagnetic waves or light with a wavelength in regions such as an ultraviolet region, a near ultraviolet region, a far ultraviolet region, a visible region, or an infrared region, but also radiation. Radiation includes, for example, microwaves, electron beams, extreme ultraviolet rays (EUV), and X-rays. In addition, laser beams such as a 248 nm excimer laser, a 193 nm excimer laser, and a 172 nm excimer laser can also be used. For these light beams, monochromatic light (single-wavelength light) passed through an optical filter may be used, or light with a plurality of different wavelengths (composite light) may be used.

The weight-average molecular weight (Mw) in the present invention is measured through gel permeation chromatography (GPC) unless otherwise specified.

A composition for forming an adhesive film for imprinting of the present invention (hereinafter, sometimes simply referred to as a "composition for forming an adhesive film") contains a resin having a polymerizable group; and a solvent, in which the resin has at least one kind of a repeating unit derived from a polymerizable compound having a C log P value less than or equal to 0, and solubility of the resin in water at 25° C. is greater than or equal to 1 mass %. The C log P value is a coefficient showing affinity of an organic compound with respect to water and 1-octanol.

By adopting such a configuration, it is possible to enhance wettability of a curable composition for imprinting to be applied to a surface of an adhesive film while achieving adhesiveness between a substrate and a cured product to be formed using a curable composition for imprinting. The reason for this is that the strength of the adhesive film is increased since the resin has a polymerizable group, the adhesive film is not destroyed when releasing a mold while it is a thin film. Therefore, it is possible to maintain the adhesiveness between the substrate and the cured product. Furthermore, it is assumed that it is possible to enhance the wettability of the curable composition for imprinting with respect to the adhesive film using a resin containing a repeating unit derived from a polymerizable compound having a C log P value less than or equal to 0. As a result, it is possible to achieve the adhesiveness and the wettability even if there is no layer such as a primer layer.

Hereinafter, the present invention will be described in detail.

<Resin>

The composition for forming an adhesive film of the present invention contains a resin (hereinafter, sometimes referred to as a "resin A") which has a polymerizable group and has at least one kind of a repeating unit derived from a polymerizable compound having a C log P value less than or equal to 0. The resin A may contain a repeating unit (repeating unit a) which is derived from a polymerizable compound having a C log P value less than or equal to 0 and contains a polymerizable group, or may contain a repeating unit (repeating unit b) which is not derived from a polymerizable compound having a C log P value less than or equal to 0 and contains a polymerizable group and a repeating unit (repeating unit c) which does not have a polymerizable group and is derived from a polymerizable compound having a C log P value less than or equal to 0. Furthermore, the resin A may contain all of the above-described repeating unit a, repeating unit b, and repeating unit c.

The resin A may contain one kind or two or more kinds of each of the repeating unit a, the repeating unit b, and the repeating unit c.

More specifically, the resin A is preferably the following resins.

(1) Resin in which repeating unit a accounts for greater than or equal to 90 mol % of all repeating units (2) Resin in which total of repeating unit b and repeating unit c accounts for greater than or equal to 90 mol % of all repeating units (3) Resin in which total of repeating unit a, repeating unit b, and repeating unit c accounts for greater than or equal to 90 mol % of all repeating units The solubility of the above-described resin A in water at 25° C. is greater than or equal to 1 mass %, preferably greater than or equal to 5 mass %, and more preferably greater than or equal to 10 mass %. The upper limit value of the above-described solubility is not particularly limited, but may be, for example, less than or equal to 90 mass %. By setting the solubility to be greater than or equal to 1 mass %, the critical surface tension increases and the wettability tends to improve.

The resin A is preferably a resin of which a main chain is formed by a carbon-carbon bond and more preferably a (meth)acrylic resin.

«Polymerizable Group»

An example of the polymerizable group used in the present invention includes an ethylenically unsaturated group, and an ethylenically unsaturated group is preferable. Specific examples of the ethylenically unsaturated group include a (meth)acrylic group ((meth)acryloyloxy group and (meth)acryloylamino group), a maleimide group, an allyl group, a vinyl ether group, and a vinyl group, and a (meth)acrylic group is preferable and a (meth)acryloyloxy group is more preferable. The resin of the present invention may contain a polymerizable group at a terminal of a main chain, but preferably contains a polymerizable group in a repeating unit. The repeating unit containing a polymerizable group may be a repeating unit derived from a polymerizable compound having a C log P value less than or equal to 0 which will be described below, or other repeating units.

The repeating unit containing a polymerizable group is preferably contained in all repeating units constituting the resin A in a proportion of 10 to 90 mol %, more preferably contained therein in a proportion of 20 to 70 mol %, and still more preferably contained therein in a proportion of 30 to 50 mol %.

The polymerizable group contained in the resin A may be used alone or in combination of two or more thereof. In a case where two or more kinds of polymerizable groups are used, the total amount is preferably within the above-described ranges.

In addition, one repeating unit may contain two or more polymerizable groups.

«Polymerizable Compound Having C log P Value Less than or Equal to 0»

The resin A contains a repeating unit derived from a polymerizable compound having a C log P value less than or equal to 0. The repeating unit derived from a polymerizable compound having a C log P value less than or equal to 0 is preferably contained in all repeating units constituting the resin A in a proportion of 10 to 90 mol %, more preferably contained therein in a proportion of 30 to 80 mol %, and still more preferably contained therein in a proportion of 50 to 70 mol %.

The polymerizable group contained in the resin A may be used alone or in combination of two or more thereof. In a case where two or more kinds of polymerizable groups are used, the total amount is preferably within the above-described ranges.

A "log P value" is a coefficient showing affinity of an organic compound with respect to water and 1-octanol. P which is a 1-octanol/water distribution coefficient is a distribution equilibrium when a trace amount of compound dissolves in solvents of two liquid phases of 1-octanol and water and is a proportion of the equilibrium concentration of the compound in the solvents. P is expressed in each logarithm log P with respect to a base 10. That is, the "log P value" is a logarithmic value of the 1-octanol/water distribution coefficient, and is known as an important parameter representing hydrophilicity or hydrophobicity of molecules.

The "C log P value" is a Log P value obtained by calculation. The C log P value can be calculated by a fragment method, an atomic approach method, or the like. More specifically, a fragment method described in literature (C. Hansch and A. Leo, "Substituent Constants for Correlation Analysis in Chemistry and Biology" (John Wiley & Sons, New York, 1969)) or commercially available SOFTWARE PACKAGE 1 or 2 described below may be used for calculating the C log P value.

SOFTWARE PACKAGE 1: MedChem Software (Release 3.54, August 1991, Medicinal Chemistry Project, Pomona College, Claremont, Calif.)

SOFTWARE PACKAGE 2: Chem Bio Draw Ultra Ver. 13.0.2.3021 (CambridgeSoft Corporation, USA)

The numerical value of the C log P value described in the present specification is a "C log P value" calculated using SOFTWARE PACKAGE 2.

The above-described C log P value is preferably 0.0 to −15.0, more preferably −1.0 to −10, and still more preferably −2.0 to −10.

The above-described polymerizable compound having a C log P value less than or equal to 0 in a first embodiment is a compound having an -alkylene group-oxygen atom-structure.

The alkylene group is preferably a linear or branched alkylene group and more preferably a linear alkylene group. The alkylene group may or may not have a substituent, but preferably has no substituent. The alkylene group is also preferably an alkylene group having 1 to 6 carbon atoms, more preferably a methylene group, an ethylene group, or a propylene group, and still more preferably an ethylene group.

The number n (for example, the number corresponding to n of a resin A-1 in examples to be described below) of repeating units consisting of an -alkylene group-oxygen atom-structure is preferably 2 to 90, more preferably 5 to 90, and still more preferably 8 to 90.

The above-described polymerizable compound having a C log P value less than or equal to 0 in a second embodiment of is a compound having at least one of an anion structure and a cation structure.

Examples of the anion structure include sulfonate ion, phosphonate ion (for example, —O—P(=O)(—O⁻)O—), carboxylate ion, and halogen ion, and sulfonate ion, phosphonate ion, and carboxylate ion are preferable. In addition, a quaternary ammonium ion is preferable as a cation structure.

It is preferable that the above-described anion structure and cation structure are bonded to each other through an alkylene group. Specifically the alkylene group is preferably a linear or branched alkylene group and more preferably a linear alkylene group. The number of carbon atoms constituting an alkylene group is preferably 2 to 8, more preferably 2 to 6, and still more preferably 2 to 4. The alkylene group may or may not have a substituent, but preferably has no substituent.

Specific examples of compounds in which the above-described anion structure and cation structure are bonded to each other through an alkylene group include a compound which has an -anion structure-alkylene group-cation structure and in which the cation structure is positioned at a terminal of the compound, and a compound which has a -cation structure-alkylene group-anion structure and in which the anion structure is positioned at a terminal of the compound.

In addition, the polymerizable compound having a C log P value less than or equal to 0 may has only one of an anion structure and a cation structure and a counter cation or a counter anion may be ionically bonded to the anion structure or the cation structure of the polymerizable compound having a C log P value less than or equal to 0. Alternately, the polymerizable compound having a C log P value less than or equal to 0 may have both the anion structure and the cation structure.

In addition, the polymerizable compound having a C log P value less than or equal to 0 in a third embodiment is a compound having an amine structure. The amine here is preferably a secondary amine, a tertiary amine, or a quaternary ammonium ion. Specific examples of the amine structure include the following groups.

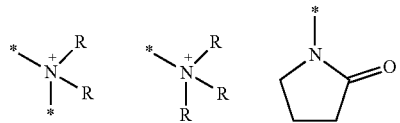

In the above, * is a binding position with another moiety. R's each independently represent a hydrogen atom, a methyl group, and an ethyl group, and a methyl group is preferable.

In addition, a fourth embodiment of the above-described polymerizable compound having a C log P value less than or equal to 0 is a form containing a hydroxyl group.

A repeating unit containing a group having a C log P value less than or equal to 0 is preferably contained in all repeating units constituting the resin A in a proportion of 10 to 90 mol %, more preferably contained therein in a proportion of 20 to 90 mol %, and still more preferably contained therein in a proportion of 50 to 90 mol %.

The group which is contained in the resin A and has a C log P value less than or equal to 0 may be used alone or in combination of two or more thereof. In a case where two or more kinds of groups are used, the total amount is preferably within the above-described ranges.

In addition, two or more groups having a C log P value less than or equal to 0 may be contained in one repeating unit.

Furthermore, the resin A preferably contains one kind or two or more kinds of a repeating unit represented by Formula (I), a repeating unit represented by Formula (II), and a repeating unit represented by Formula (III).

Formula (I)

Formula (II)

Formula (III)

In Formulae (I) to (III), R's each independently represent a hydrogen atom, a methyl group, or a hydroxymethyl group, T's each independently represent a single bond, *—C(=O)O—, or *—C(=O)NH—, bonding to a main chain is carried out on a * side, L's each independently represent a single bond or a divalent linking group, P's each independently represent a polymerizable group, and Q is a divalent linking group or a monovalent linking group; provided that a polymerizable compound which becomes a raw material constituting the above-described repeating units has a C log P value less than or equal to 0.

R is preferably a hydrogen atom or a methyl group.

T represents a single bond, *—C(=O)O— or *—C(=O)NH—. *—C(=O)O— or *—C(=O)NH— is preferable and *—C(=O)O— is more preferable.

L represents a single bond or a divalent linking group. A single bond, a substituted or unsubstituted hydrocarbon group (an alkylene group and an arylene group are preferable), —NH—, C(=O)—, —O—, —S—, —C(=O)O—, —C(=O)NH—, or a combination thereof is preferable and a single bond, an alkylene group, and an alkylene group having a hydroxyl group as a substituent are more preferable. The number of carbon atoms constituting an alkylene group is preferably 1 to 5 and more preferably 2 to 4. In addition, the alkylene group is preferably a linear alkylene group.

P represents a polymerizable group. An ethylenically unsaturated group is more preferable, a (meth)acrylic group is still more preferable, and an acryloyl group is still more preferable.

Q in the first embodiment is a monovalent substituent or a divalent linking group which has an -alkylene group-oxygen atom-structure.

The alkylene group is preferably a linear or branched alkylene group and more preferably a linear alkylene group. The alkylene group may or may not have a substituent, but preferably has no substituent. The alkylene group is also preferably an alkylene group having 1 to 6 carbon atoms, more preferably a methylene group, an ethylene group, or a propylene group, and still more preferably an ethylene group.

The number n (for example, corresponding to n of a resin A-1 in examples to be described below) of repeating units consisting of an -alkylene group-oxygen atom-structure is preferably 2 to 90, more preferably 8 to 90, and still more preferably 13 to 90.

In a case where Q is positioned at a terminal of a side chain of the resin A, that is, in a case where Q is a monovalent linking group, Q is preferably represented by -(alkylene group-oxygen atom)$_n$-hydrogen atom (terminal side).

Q in the second embodiment is a monovalent linking group or a divalent linking group which has at least one of an anion structure and a cation structure.

Examples of the anion structure include sulfonate ion, phosphonate ion (for example, —O—P(=O)(—O⁻)O—), carboxylate ion, and halogen ion, and sulfonate ion, phosphonate ion, and carboxylate ion are preferable. In addition, a quaternary ammonium ion is preferable as a cation structure.

It is preferable that the above-described anion structure and cation structure are bonded to each other through an alkylene group. Specifically the alkylene group is preferably a linear or branched alkylene group and more preferably a linear alkylene group. The number of carbon atoms constituting an alkylene group is preferably 2 to 8, more preferably 2 to 6, and still more preferably 2 to 4. The alkylene group may or may not have a substituent, but preferably has no substituent.

Specific examples of forms in which the above-described anion structure and the cation structure are bonded to each other through an alkylene group include aspects of -anion structure-alkylene group-cation structure (terminal side) and -anion structure-alkylene group-cation structure (terminal side).

In addition, only one of the anion structure and the cation structure may be included, and the other may be ionically bonded as a counter cation or a counter anion of a repeating unit.

Q in the third embodiment is a monovalent substituent or a divalent linking group which has an amine structure. The amine here is preferably a secondary amine, a tertiary amine, or a quaternary ammonium ion. Specific examples of the amine structure include the following groups.

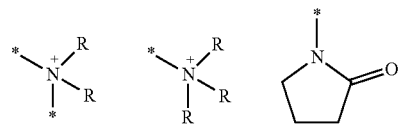

In the above, * is a binding position with another moiety. R's each independently represent a hydrogen atom, a methyl group, and an ethyl group, and a methyl group is preferable.

Q in the fourth embodiment is a monovalent substituent or a divalent linking group which contains a hydroxyl group.

The resin A in the first embodiment of the present invention is a resin containing a repeating unit represented by Formula (I) and a repeating unit represented by Formula (II). In the first embodiment, a total of the repeating unit represented by Formula (I) and the repeating unit represented by Formula (II) preferably accounts for greater than or equal to 90 mol % of all repeating units. In the first embodiment, the molar ratio of the repeating unit represented by Formula (I) to the repeating unit represented by Formula (II) is preferably 1 to 99:99 to 1.

The resin A in the second embodiment of the present invention is a resin containing a repeating unit represented by Formula (I) and a repeating unit represented by Formula (III). In the second embodiment, a total of the repeating unit represented by Formula (I) and the repeating unit represented by Formula (III) preferably accounts for greater than or equal to 90 mol % of all repeating units. In the second embodiment, the molar ratio of the repeating unit represented by Formula (I) to the repeating unit represented by Formula (III) is preferably 5 to 90:95 to 10.

The resin A in the third embodiment of the present invention is a resin containing a repeating unit represented by Formula (II). In the third embodiment, the repeating unit represented by Formula (II) preferably accounts for greater than or equal to 90 mol % of all repeating units.

In the first to third embodiments, the repeating units represented by Formulae (I) to (III) each may be only one kind or two or more kinds thereof.

The resin A may contain repeating units other than the above-described repeating unit a, repeating unit b, and repeating unit c. Specific examples thereof include a repeating unit having an -alkylene group-oxygen atom-structure in a main chain and a structure having at least one of an anion structure and a cation structure in a main chain, and a repeating unit having an -alkylene group-oxygen atom-structure in a main chain is preferable. Examples of the details of the above-described -alkylene group-oxygen atom-structure, anion structure, and cation structure include the -alkylene group-oxygen atom-structure described in the first embodiment of the above-described polymerizable compound having a C log P value less than or equal to 0, and the anion structure and the cation structure described in the second embodiment of the above-described polymerizable compound having a C log P value less than or equal to 0.

Examples of a main chain structure other than the above-mentioned -alkylene group-oxygen atom-structure or a structure having at least one of an anion structure and a cation structure include an alkylene group, a carbonyl group, an oxygen atom, and a combination thereof which may have a substituent.

In a case where the resin A contains repeating units other than the above-described repeating unit a, repeating unit b, and repeating unit c, the proportion is preferably 5 to 20 mol % in molar ratio.

In addition, the resin A may have a structure having at least one of the anion structure and the cation structure in a terminal group, or may have a structure having both the anion structure and the cation structure in a terminal group.

Examples of details of the above-described anion structure and cation structure include the anion structure and the cation structure described in the second embodiment of the above-described polymerizable compound having a C log P value less than or equal to 0.

Specific examples of the resin A include resins A-1 to A-26 used in examples to be described below.

The weight-average molecular weight of the resin A is preferably greater than or equal to 1,000, more preferably greater than or equal to 3,000, and still more preferably greater than or equal to 4,500. In addition, the weight-average molecular weight of the resin A is preferably less than or equal to 200,000, more preferably less than or equal to 180,000, and still more preferably greater than or equal to 100,000.

The content of the resin A contained in the composition for forming an adhesive film of the present invention in a solid content contained in the above-described composition for forming an adhesive film is preferably greater than or equal to 30 mass %, more preferably greater than or equal to 50 mass %, still more preferably greater than or equal to 70 mass %, and still more preferably greater than or equal to 89 mass %. The content of the above-described resin A in the solid content contained in the above-described composition for forming an adhesive film is less than or equal to 100 mass %.

The resin A contained in the composition for forming an adhesive film may be used alone or in combination of two or more thereof. In a case where the composition for forming an adhesive layer contains two or more kinds thereof, the total amount is preferably within the above-described ranges.

The composition for forming an adhesive film may contain a resin other than the resin A. In a case where the composition for forming an adhesive film contains a resin other than the resin A, that is, in a case where the content of the resin exceeds 0 mass % in the composition, the content of the resin other than the resin A in all resins contained in the composition for forming an adhesive film is preferably less than or equal to 50 mass %, more preferably less than or equal to 30 mass %, and still more preferably less than or equal to 20 mass %.

In addition, in the case where the composition for forming an adhesive film contains the resin other than the resin A, the composition for forming an adhesive film preferably contains at least one of a resin which has a polymerizable group and does not have a repeating unit derived from a polymerizable compound having a C log P value less than or equal to 0, and a resin which does not have a polymerizable group and has a repeating unit derived from a polymerizable compound having a C log P value less than or equal to 0, as the resin other than the resin A.

<Solvent>

The composition for forming an adhesive film of the present invention contains a solvent. The solvent may be water, an organic solvent, or a mixture of water and an organic solvent.

The solvent is preferably water or a solvent having any one of an ester group, a carbonyl group, a hydroxyl group, or an ether group.

Water, propylene glycol monoalkyl ether carboxylate, propylene glycol monoalkyl ether, lactate, acetate, alkoxypropionic acid ester, linear ketone, cyclic ketone, lactone, and alkylene carbonate are selected as specific examples of the solvent.

As propylene glycol monoalkyl ether carboxylate, at least one selected from the group consisting of propylene glycol monomethyl ether acetate, propylene glycol monomethyl ether propionate, and propylene glycol monoethyl ether acetate is preferable and propylene glycol monomethyl ether acetate is particularly preferable.

In addition, as propylene glycol monoalkyl ether, propylene glycol monomethyl ether or propylene glycol monoethyl ether is preferable.

As lactate, ethyl lactate, butyl lactate, or propyl lactate are preferable.

As acetate, methyl acetate, ethyl acetate, butyl acetate, isobutyl acetate, propyl acetate, isoamyl acetate, methyl formate, ethyl formate, butyl formate, propyl formate, or 3-methoxybutyl acetate is preferable.

Butyl butyrate is also preferable.

As alkoxypropionic acid ester, methyl 3-methoxypropionate (MMP) or ethyl 3-ethoxypropionate (EEP) is preferable.

As linear ketone, 1-octanone, 2-octanone, 1-nonanone, 2-nonanone, acetone, 4-heptanone, 1-hexanone, 2-hexanone, diisobutyl ketone, phenylacetone, methyl ethyl ketone, methyl isobutyl ketone, acetylacetone, acetonylacetone, ionone, diacetonyl alcohol, acetyl carbinol, acetophenone, methyl naphthyl ketone, or methyl amyl ketone is preferable.

As cyclic ketone, methyl cyclohexanone, isophorone, or cyclohexanone is preferable.

As lactone, γ-butyrolactone is preferable.

As alkylene carbonate, propylene carbonate is preferable.

In addition to the above-described components, the number of carbon atoms is greater than or equal to 7 (preferably 7 to 14, more preferably 7 to 12, and still more preferably 7 to 10), and it is preferable to use an ester-based solvent having 2 or less heteroatoms.

Preferred examples of an ester-based solvent having 7 or more carbon atoms and 2 or more heteroatoms include amyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, and it is particularly preferable to use isoamyl acetate.

In addition, it is preferable to use one having a flash point (hereinafter, also referred to as fp) of higher than or equal to 37° C. As such components (M2), propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), methyl 2-hydroxyisobutyrate (fp: 45° C.), γ-butyrolactone (fp: 101° C.), or propylene carbonate (fp: 132° C.) is preferable. Among these, propylene glycol monoethyl ether, ethyl lactate, pentyl acetate, or cyclohexanone is more preferable, and propylene glycol monoethyl ether or an ethyl lactate is particularly preferable. Here, the "flash point" means a value described in reagent catalogs of Tokyo Chemical Industry Co., Ltd. or Sigma-Aldrich Co. LLC.

At least one selected from the group consisting of water, propylene glycol monomethyl ether acetate (PGMEA), ethoxyethyl propionate, cyclohexanone, 2-heptanone, γ-butyrolactone, butyl acetate, propylene glycol monomethyl ether (PGME), ethyl lactate, and 4-methyl-2-pentanol is used as a preferred solvent, and at least one selected from the group consisting of PGMEA, PGME, and water is more preferable.

The content of the above-described solvent in the above-described composition for forming an adhesive film is preferably greater than or equal to 85.0 mass % and more preferably greater than or equal to 88.0 mass %. In addition, the content of the above-described solvent in the above-described composition is preferably less than or equal to 99.9 mass %, and may be less than or equal to 95.0 mass %.

One kind or two or more kinds of the solvents may be contained in the composition for forming an adhesive film. In a case where the composition for forming an adhesive layer contains two or more kinds of solvents, the total amount is preferably within the above-described ranges.

<Non-Polymerizable Alkylene Glycol Compound>

The composition for forming an adhesive film of the present invention may contain a non-polymerizable alkylene glycol compound in addition to the above-described resin A. The non-polymerizable alkylene glycol compound referred to herein is distinguished from the above-described resin A from the viewpoint of having no polymerizable group.

The non-polymerizable alkylene glycol compound preferably has 3 to 1,000 alkylene glycol constitutional units, more preferably has 4 to 500 alkylene glycol constitutional units, still more preferably has 5 to 100 alkylene glycol constitutional units, and still more preferably has 5 to 50 alkylene glycol constitutional units.

The weight-average molecular weight (Mw) of the non-polymerizable alkylene glycol compound is preferably 150 to 10,000, more preferably 200 to 5,000, still more preferably 300 to 3,000, and still more preferably 300 to 1,000.

Examples of the non-polymerizable alkylene glycol compound include polyethylene glycol, polypropylene glycol, mono- or dimethyl ether thereof, mono- or dioctyl ether, mono- or dinonyl ether, mono- or didecyl ether, monostearic acid ester, monooleic acid ester, monoadipic acid ester, and monosuccinic acid ester, and polyethylene glycol and polypropylene glycol are preferable.

The surface tension of the non-polymerizable alkylene glycol compound at 25° C. is preferably greater than or equal to 38 mN/m and more preferably greater than or equal to 40 mN/m. The upper limit of the surface tension is not particularly limited, but is, for example, less than or equal to 48 mN/m. By blending such compounds, it is possible to further improve wettability of the curable composition for imprinting which will be provided immediately above an adhesive film.

In a case where a non-polymerizable alkylene glycol compound is contained, the content thereof is less than or equal to 40 mass % of the solid content of the composition for forming an adhesive film, preferably less than or equal to 30 mass %, more preferably less than or equal to 20 mass %, and still more preferably 5 to 15 mass %.

The non-polymerizable alkylene glycol compound may be used alone or in combination of two or more thereof. In a case where two or more kinds of the non-polymerizable alkylene glycol compounds are used, the total amount is preferably within the above-described ranges.

The composition for forming an adhesive film may contain an additive such as a surfactant within the scope not departing from the gist of the present invention in addition to the above. However, it is preferable that the composition for forming an adhesive film of the present invention does not substantially contain components other than the resin A, the solvent, and the non-polymerizable alkylene glycol compound. The expression "does not substantially contain" means that the content is less than or equal to 0.001% of the solid content of the composition for forming an adhesive film.

The composition for forming an adhesive film of the present invention may contain a polymerization initiator, but can also have a configuration in which a polymerization initiator is not substantially contained. The expression "does not substantially contain" means that the content is less than or equal to 0.001% of the solid content of the composition for forming an adhesive film.

The composition for forming an adhesive film of the present invention preferably contains 0.1 to 20 mass % of other components such as a resin A constituting an adhesive film, and 80.0 to 99.9 mass % of a solvent.

It is possible to use a well-known storage container in the related art as a storage container of the composition for forming an adhesive film used in the present invention. In addition, it is preferable to use a multilayer bottle obtained by forming the inner wall of a container with 6 types and 6 layers of resins or a bottle obtained by forming 6 kinds of resins into a 7-layer structure as the storage container in order to suppress mixing of impurities into a raw material or a composition. Examples of such a container include containers disclosed in JP-2015-123351A.

<Method for Producing Cured Product Pattern>

The method for producing a cured product pattern of the present invention includes: an adhesive film formation step of forming an adhesive film by applying the composition for forming an adhesive film for imprinting of the present invention; an application step of applying the curable composition for imprinting onto a surface of the adhesive film; a mold contact step of bringing the curable composition for imprinting into contact with a mold having a pattern for transferring a pattern shape; a light irradiation step of irradiating the curable composition for imprinting with light to obtain a cured product; and a release step of separating the cured product from the mold.

Hereinafter, a method for forming a cured product pattern (method for producing a cured product pattern) will be described according to FIG. 1. Needless to say, the configuration of the present invention is not limited to FIG. 1.

«Adhesive Film Formation Step»

In the adhesive film formation step, an adhesive film 2 is formed by applying the composition for forming an adhesive film for imprinting of the present invention onto a substrate 1 as shown in FIG. 1, for example. The surface of the substrate 1 may be subjected to surface treatment.

The method for applying a composition for forming an adhesive film onto a substrate is not particularly limited, and a disclosure of paragraph 0102 of JP 2010-109092A (the publication number of its corresponding US application is US2011/0199592) can be referred to, and the contents thereof are incorporated in the present specification. In the present invention, a spin coating method or an inkjet method is preferable.

More specifically, after applying a composition for forming an adhesive film onto a substrate, a solvent is preferably volatilized (dried) using heat or through light irradiation to form an adhesive film as a thin film.

The material of the substrate is not particularly limited, and a disclosure of paragraph 0103 of JP 2010-109092A (the publication number of its corresponding US application is US2011/0199592) can be referred to, and the contents thereof are incorporated in the present specification. In addition to the above, examples thereof include a sapphire substrate, a silicon carbide substrate, a gallium nitride substrate, an aluminum substrate, an amorphous aluminum oxide substrate, a polycrystalline aluminum oxide substrate, and a substrate made of GaAsP, GaP, AlGaAs, InGaN, GaN, AlGaN, ZnSe, AlGaInP, or ZnO. Examples of specific materials of a glass substrate include aluminosilicate glass, aluminoborosilicate glass, and barium borosilicate glass. In the present invention, a silicon substrate is preferable.

The adhesive film of the present invention is formed of the composition for forming an adhesive film of the present invention. The critical surface tension of the adhesive film is preferably greater than or equal to 45 mN/m, more preferably greater than or equal to 46 mN/m, and still more preferably greater than or equal to 48 mN/m. The upper limit value thereof is not particularly limited, but can be set to be, for example, less than or equal to 60 mN/m, less than or equal to 55 mN/m, and less than or equal to 50 mN/m.

The thickness of an adhesive film is preferably greater than or equal to 0.1 nm, more preferably greater than or equal to 0.5 nm, and still more preferably greater than or equal to 1 nm. In addition, the thickness of an adhesive film is preferably less than or equal to 20 nm, more preferably less than or equal to 15 nm, and still more preferably less than or equal to 10 nm.

Accordingly, the above-described laminate of the present invention has a substrate and an adhesive film positioned on a surface of the above-described substrate, and the above-described adhesive film is the adhesive film formed of the composition for forming an adhesive film of the present invention. In the present invention, the adhesive film preferably interacts with the above-described substrate. An example of the interaction here includes at least one selected from the group consisting of a covalent bond, an ionic bond, and a hydrogen bond.

«Application Step»

In the application step, a curable composition for imprinting 3 is applied on the surface of the above-described adhesive film 2 as shown in FIG. 1, for example.

The method for applying a curable composition for imprinting is not particularly limited, and a disclosure of paragraph 0102 of JP 2010-109092A (the publication number of its corresponding US application is US2011/0199592) can be referred to, and the contents thereof are incorporated in the present specification. The above-described application is preferably performed through an inkjet method. In addition, the curable composition for imprinting may be applied through multiple coating. In a method for disposing liquid droplets on the surface of an adhesive film through an inkjet method or the like, the amount of liquid droplets is preferably about 1 to 20 pL, and the liquid droplets are preferably disposed on the surface of the adhesive film at intervals between the liquid droplets. As the intervals between the liquid droplets, intervals of 10 to 1,000 μm are preferable. In the case of the inkjet method, the intervals between the liquid droplets are set as intervals at which inkjet nozzles are disposed.

Furthermore, the volume ratio of the layer-shaped curable composition for imprinting 3 to the adhesive film 2 when applied onto the substrate is preferably 1:1 to 500, more preferably 1:10 to 300, and still more preferably 1:50 to 200.

The details of the curable composition for imprinting will be described below.

«Mold Contact Step»

In the mold contact step, the above-described curable composition for imprinting 3 is brought into contact with a mold 4 having a pattern for transferring a pattern shape as shown in FIG. 1, for example. Through such steps, a desired cured product pattern (imprint pattern) is obtained.

Specifically, in order to transfer a desired pattern to a layer-shaped curable composition for imprinting, the mold 4 is brought into press contact with the surface of the layer-shaped curable composition for imprinting 3.

The mold may be a light-transmitting mold or a light non-transmitting mold. In a case where a light-transmitting mold is used, it is preferable to radiate light from the mold side. On the other hand, in a case where a light non-transmitting mold is used, it is preferable to use a light-transmitting substrate as a substrate to radiate light from the substrate side. In the present invention, it is preferable to radiate light from a mold side using a light-transmitting mold.

A mold which can be used in the present invention is a mold having a pattern to be transferred. Regarding the pattern of the above-described mold, it is possible to form a pattern according to a desired processing accuracy, for example, through photolithography, or an electron beam drawing method. In the present invention, the mold pattern producing method is not particularly limited. In addition, it is possible to use a pattern formed through the method for producing a cured product pattern of the present invention as a mold.

Materials constituting the light-transmitting mold used in the present invention are not particularly limited. Examples thereof include glass, quartz, polymethyl methacrylate (PMMA), a light-transmitting resin such as a polycarbonate resin, a transparent metal vapor deposition film, a flexible film such as polydimethylsiloxane, a photocured film, and a metal film, and quartz is preferable.

Materials of the light non-transmitting mold used in a case where a light-transmitting substrate of the present invention is used are not particularly limited, but may have a predetermined strength. Specific examples thereof include a ceramic material, an vapor deposition film, a magnetic film, a reflective film, a metal substrate of Ni, Cu, Cr, Fe or the like, a substrate of SiC, silicon, silicon nitride, polysilicon, silicon oxide, amorphous silicon, or the like, but are not particularly restricted.

In the above-described method for producing a cured product pattern, in a case where imprint lithography is performed using a curable composition for imprinting, it is preferable to set the mold pressure to be less than or equal to 10 atm. By setting the mold pressure to be lower than or equal to 10 atm, it is difficult for a mold and a substrate to deform, and the pattern accuracy tends to improve. In addition, it is preferable from the viewpoint that the size of a device tends to be reduced due to low pressurization. The mold pressure is preferably selected from a range within which the uniformity of mold transfer can be secured within a range where a residual film of a curable composition for imprinting of a mold convex portion is reduced.

In addition, it is also preferable to bring the curable composition for imprinting into contact with the mold in an atmosphere containing helium gas or condensible gas or containing both helium gas and condensable gas.

«Light Irradiation Step»

In the light irradiation step, the above-described curable composition for imprinting is irradiated with light to obtain a cured product. The irradiation dose of light irradiation in the light irradiation step may be sufficiently larger than the minimum irradiation dose required for hardening. The irradiation amount necessary for hardening is appropriately determined by investigating the amount of consumption of unsaturated bonds of the curable composition for imprinting or the like.

The type of light to be radiated is not particularly limited, but an example thereof includes ultraviolet light.

In addition, regarding the temperature of a substrate in a case of light irradiation in imprint lithography applied to the present invention, light irradiation is usually performed at room temperature, but may be performed while heating in order to enhance the reactivity. In a case where the environment is kept in a vacuum condition as a preliminary stage of light irradiation, it is effective to prevent air bubbles from being mixed in, suppress a decrease in reactivity due to oxygen mixed in, and improve the adhesiveness between a mold and a curable composition for imprinting. Therefore, light irradiation may be performed in a vacuum condition. In addition, in the above-described method for producing a cured product pattern, the preferred degree of vacuum at the time of light irradiation is within a range of $10^{-1}$ Pa to an atmospheric pressure.

In a case of exposure, it is desirable to set the exposure illuminance to be within a range of 1 mW/cm$^2$ to 500 mW/cm$^2$.

The above-described method for producing a cured product pattern may include a step of hardening a layer-shaped curable composition for imprinting (pattern forming layer) through light irradiation, and then, further hardening the hardened pattern by adding heat as necessary. The temperature for heating and hardening a curable composition for imprinting after light irradiation is preferably 150° C. to 280° C. and more preferably 200° C. to 250° C. In addition, the time for applying heat is preferably 5 to 60 minutes and more preferably 15 to 45 minutes.

«Release Step»

In the release step, the above-described cured product and the above-described mold are separated from each other. The obtained cured product pattern can be used for various applications as will be described below.

That is, the laminate is disclosed in the present invention which further has a cured product pattern formed of a curable composition for imprinting on the surface of the above-described adhesive film in order of the above-described substrate, the above-described adhesive film, and the above-described cured product pattern.

Furthermore, as will be described below, etching or the like can also be performed.

<Cured Product Pattern and Application Thereof>

A cured product pattern formed through the above-described method for producing a cured product pattern as described above can be used as a permanent film used in a liquid crystal display device (LCD) or the like or an etching resist for manufacturing a semiconductor element (lithography mask).

In particular, the present invention discloses a method for manufacturing a circuit substrate, the method including a step of obtaining a cured product pattern through the method for producing a cured product pattern of the present invention. Furthermore, the method for manufacturing a circuit substrate of the present invention may further include a step of performing etching or ion implantation on a substrate using a cured product pattern as a mask through the above-described method for producing a cured product pattern, and a step of forming an electronic member. The above-described circuit substrate is preferably a semiconductor element. Furthermore, the present invention discloses a method for manufacturing an electronic device, the method including a step of obtaining a circuit substrate through the above-described method for manufacturing a circuit substrate and a step of connecting the above-described circuit substrate to a control mechanism that controls the above-described circuit substrate.

In addition, it is possible to form a grid pattern on a glass substrate of a liquid crystal display device using the pattern formed through the above-described method for producing a cured product pattern to manufacture a polarizing plate having a large screen size (for example, larger than 55 inches or 60 inches) with little reflection and absorption at low cost. For example, polarizing plates disclosed in JP2015-132825A or WO2011/132649A can be manufactured. 1 inch is 25.4 mm.

The cured product pattern formed in the present invention is also useful as an etching resist (lithography mask) as shown in FIG. 1. In a case of using a cured product pattern as an etching resist, a fine cured product pattern is first formed on a substrate, for example, in a nano or micron order through the above-described method for producing a cured product pattern using a silicon substrate (such as silicon wafer) in which, for example, a thin film of SiO$_2$ or the like, is formed as a substrate. In the present invention, it is particularly beneficial from the viewpoint that it is possible to form a fine pattern in a nano order, and it is also possible to form a pattern having a size of less than or equal to 50 nm and particularly a size of less than or equal to 30 nm. The lower limit value of the size of the cured product pattern formed through the above-described method for producing a cured product pattern is not particularly specified, but can be set to be, for example, greater than or equal to 1 nm.

In addition, the present invention also discloses a method for manufacturing a mold for imprinting, the method including a step of obtaining a cured product pattern on a substrate through the method for producing a cured product pattern of the present invention and a step of performing etching on the above-described substrate using the obtained cured product pattern.

A desired cured product pattern can be formed on a substrate by etching with hydrogen fluoride or the like in a case of wet etching or with etching gas such as CF$_4$ in a case of dry etching. The cured product pattern has good etching resistance, particularly to dry etching. That is, the pattern formed through the above-described method for producing a cured product pattern is preferably used as a lithography mask.

Specifically, the pattern formed in the present invention can be preferably used for producing a recording medium such as a magnetic disk, a light-receiving element such as a solid image pickup element, a light emitting element such as a light emitting diode (LED) or organic electroluminescence (organic EL), an optical device such as a liquid crystal display (LCD) device, a diffraction grating, a relief hologram, optical components such as an optical waveguide, an optical filter, and a microlens array, a thin film transistor, an organic transistor, a color filter, an anti-reflection film, a polarizing plate, a polarizing element, an optical film, flat panel display member such as a column material, a nano-biodevice, an immunological analysis chip, deoxyribonucleic acid (DNA) separation chip, a microreactor, photonic liquid crystal, a guide pattern for forming a fine pattern (directed self-assembly, DSA) using self-assembly of a block copolymer, and the like.

<Curable Composition for Imprinting>

Next, the curable composition for imprinting used in the present invention will be described.

The curable composition for imprinting used in the present invention is not particularly limited, and a well-known curable composition for imprinting can be used, and the curable composition for imprinting preferably contains at least a polymerizable compound.

In the present invention, it is preferable that the viscosity of the curable composition for imprinting is designed to be low and the surface tension is designed to be high so as to enable high-speed filling into a mold pattern using a capillary force.

Specifically, the viscosity of the curable composition for imprinting at 23° C. is preferably less than or equal to 20.0 mPa·s, more preferably less than or equal to 15.0 mPa·s, and still more preferably less than or equal to 11.0 mPa·s. The lower limit value of the above-described viscosity is not particularly limited, but can be set to be, for example, greater than or equal to 5.0 mPa·s.

In addition, the surface tension of the curable composition for imprinting at 25° C. is preferably greater than or equal to 30 mN/m and more preferably greater than or equal to 32 mN/m. In a case where a curable composition for imprinting with a high surface tension is used, the capillary force increases, which enables high-speed filling of a mold pattern with the curable composition for imprinting. The upper limit value of the above-described surface tension is not particularly limited, but is preferably less than or equal to 40 mN/m and more preferably less than or equal to 38 mN/m from the viewpoint of imparting inkjet suitability.

The present invention is highly meaningful from the viewpoint that use of a predetermined adhesive film improves wettability of a curable composition for imprinting which has a high surface tension and poor wettability on an adhesive film while having a high capillary force and good filling properties into a mold pattern.

The surface tension of curable composition for imprinting at 25° C. is measured according to a method to be described in examples below.

In the present invention, the content of a solvent in the curable composition for imprinting is preferably less than or equal to 5 mass %, more preferably less than or equal to 3 mass %, and still more preferably less than or equal to 1 mass % with respect to the curable composition for imprinting.

In addition, it is possible to employ an aspect in which the curable composition for imprinting used in the present invention does not substantially contain a polymer (polymer having a weight-average molecular weight of preferably greater than 1,000, more preferably greater than 2,000, and still more preferably greater than or equal to 10,000). The expression "does not substantially contain a polymer" means, for example, that the content of a polymer is less than or equal to 0.01 mass % of the curable composition for imprinting and preferably less than or equal to 0.005 mass %. It is more preferable that the curable composition for imprinting contains no polymer at all.

«Polymerizable Compound»

The polymerizable compound contained in the curable composition for imprinting used in the present invention may be a monofunctional polymerizable compound or a polyfunctional polymerizable compound, or a mixture of both compounds. In addition, it is preferable that at least a part of a polymerizable compound contained in the curable composition for imprinting is a liquid at 25° C. and it is more preferable that greater than or equal to 15 mass % of a polymerizable compound contained in the curable composition for imprinting is a liquid at 25° C.

The type of monofunctional polymerizable compound used in the curable composition for imprinting is not particularly defined as long as the type thereof does not depart from the gist of the present invention.

The molecular weight of the monofunctional polymerizable compound used in the curable composition for imprinting is preferably greater than or equal to 100, more preferably greater than or equal to 200, and still more preferably greater than or equal to 220. The molecular weight is preferably less than or equal to 1,000, more preferably less than or equal to 800, still more preferably less than or equal to 300, and particularly preferably less than or equal to 270. In a case where the lower limit value of the molecular weight is set to be greater than or equal to 100, there is a tendency that it is possible to suppress the volatility. In a case where the upper limit value of the molecular weight is set to be less than or equal to 1,000, there is a tendency that it is possible to reduce the viscosity.

The boiling point of the monofunctional polymerizable compound used in the curable composition for imprinting at 667 Pa is preferably greater than or equal to 85° C., more preferably greater than or equal to 110° C., and still more preferably greater than or equal to 130° C. By setting the boiling point at 667 Pa to be greater than or equal to 85° C., it is possible to suppress the volatility. The upper limit value of the boiling point is not particularly specified, but the boiling point at 667 Pa can be set, for example, to be less than or equal to 200° C.

The kind of polymerizable group included in the monofunctional polymerizable compound used in the curable composition for imprinting is not particularly specified, but is, for example, an ethylenically unsaturated bond-containing group and an epoxy group and preferably an ethylenically unsaturated bond-containing group. Examples of the ethylenically unsaturated bond-containing group include a (meth)acryloyl group and a vinyl group, more preferably a (meth)acryloyl group, and still more preferably an acryloyl group. In addition, the (meth)acryloyl group is preferably a (meth)acryloyloxy group.

The kinds of atoms constituting the monofunctional polymerizable compound used in the curable composition for imprinting is not particularly specified, but the monofunctional polymerizable compound thereof is preferably constituted of only atoms selected from carbon atoms, oxygen atoms, hydrogen atoms, and halogen atoms, and is more preferably constituted of only atoms selected from carbon atoms, oxygen atoms, and hydrogen atoms.

The preferred first embodiment of the monofunctional polymerizable compound used in the curable composition for imprinting is a compound having a linear or branched hydrocarbon chain having 4 or more carbon atoms.

The hydrocarbon chain in the present invention represents an alkyl chain, an alkenyl chain, and an alkynyl chain, preferably an alkyl chain and an alkenyl chain, and more preferably an alkyl chain.

In the present invention, the alkyl chain represents an alkyl group and an alkylene group. Similarly, the alkenyl chain represents an alkenyl group and an alkenylene group, and the alkynyl chain represents an alkynyl group and an alkynylene group. Among these, a linear or branched alkyl group or alkenyl group is more preferable, a linear or branched alkyl group is still more preferable, and a linear alkyl group is still more preferable.

The above-described linear or branched hydrocarbon chain (preferably, alkyl group) has 4 or more carbon atoms, preferably has 6 or more carbon atoms, more preferably has 8 or more carbon atoms, still more preferably 10 or more carbon atoms, and particularly preferably 12 or more carbon atoms. The upper limit value of the number of carbon atoms is not particularly specified, but the number of carbon atoms can be set, for example, to be less than or equal to 25.

The above-described linear or branched hydrocarbon chain may contain an ether group (—O—), but preferably has no ether group from the viewpoint of improving the releasability.

By using a relatively small addition amount of such a monofunctional polymerizable compound having a hydrocarbon chain, the elasticity of a cured product (pattern) is reduced and the releasability improves. In addition, in a case where a monofunctional polymerizable compound having a linear or branched alkyl group is used, the interfacial energy between a mold and a cured product (pattern) is reduced, and therefore, it is possible to further improve the releasability.

Examples of a preferred hydrocarbon group included in the monofunctional polymerizable compound used in the curable composition for imprinting include (1) to (3).

(1) Linear alkyl groups having 8 or more carbon atoms
(2) Branched alkyl groups having 10 or more carbon atoms
(3) Alicyclic or Aromatic Ring Substituted with Linear or Branched Alkyl Group Having 5 or More Carbon Atoms (1) Linear Alkyl Groups Having 8 or More Carbon Atoms Among the linear alkyl groups having 8 or more carbon atoms, branched alkyl groups having 10 or more carbon atoms are more preferable, branched alkyl groups having 11 or more carbon atoms are still more preferable, and branched alkyl groups having 12 or more carbon atoms are particularly preferable. In addition, linear alkyl groups having 20 or less carbon atoms are preferable, linear alkyl groups having 18 or less carbon atoms are more preferable, linear alkyl groups having 16 or less carbon atoms are still more preferable, and linear alkyl groups having 14 or less carbon atoms are particularly preferable.

(2) Branched Alkyl Groups Having 10 or More Carbon Atoms

Among the above-described branched alkyl groups having 10 or more carbon atoms, branched alkyl groups having 10 to 20 carbon atoms are preferable, branched alkyl groups having 10 to 16 carbon atoms are more preferable, branched alkyl groups having 10 to 14 carbon atoms are still more preferable, and branched alkyl groups having 10 to 12 carbon atoms are particularly preferable.

(3) Alicyclic or Aromatic Ring Substituted with Linear or Branched Alkyl Group Having 5 or More Carbon Atoms The linear or branched alkyl group having 5 or more carbon atoms is more preferably a linear alkylene group. The number of carbon atoms in the above-described alkyl group is still more preferably 6 or more, still more preferably 7 or more, and still more preferably 8 or more. The number of carbon atoms in the alkyl group is preferably 14 or less, more preferably 12 or less, and still more preferably 10 or less.

A ring of an alicyclic or aromatic ring may be a monocyclic ring or a fused ring, but is preferably a monocyclic ring. In a case where the ring thereof is a fused ring, the number of rings is preferably 2 or 3. The ring is preferably a 3- to 8-membered ring, more preferably a 5- to 6-membered ring, and still more preferably a 6-membered ring. In addition, the ring is an alicyclic ring or an aromatic ring, but is preferably an aromatic ring. Specific examples of the ring include a cyclohexane ring, a norbornane ring, an isobornane ring, a tricyclodecane ring, a tetracyclododecane ring, an adamantane ring, a benzene ring, a naphthalene ring, an anthracene ring, and a fluorene ring, among which a cyclohexane ring, a tricyclodecane ring, an adamantane ring, and a benzene ring are more preferable and a benzene ring is still more preferable.

The monofunctional polymerizable compound used in the curable composition for imprinting is preferably a compound in which a linear or branched hydrocarbon chain having 4 or more carbon atoms is directly bonded to a polymerizable group or through a linking group, and is more preferably a compound in which any one of the above-described (1) to (3) is directly bonded to a polymerizable group. Examples of the linking group include —O—, —C(=O)—, —CH$_2$—, or a combination thereof. Linear alkyl (meth)acrylate in which a (1) linear alkyl group having 8 or more carbon atoms is directly bonded to a (meth)acryloyloxy group is particularly preferable as the monofunctional polymerizable compound used in the present invention.

Examples of the monofunctional polymerizable compound of the first embodiment include the following first group and second group. However, it goes without saying that the present invention is not limited thereto. In addition, the first group is more preferable than the second group.

First Group

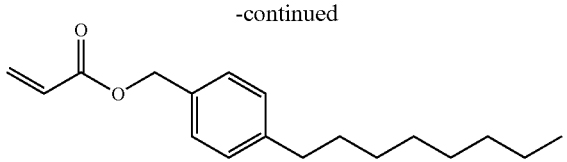

Second Group

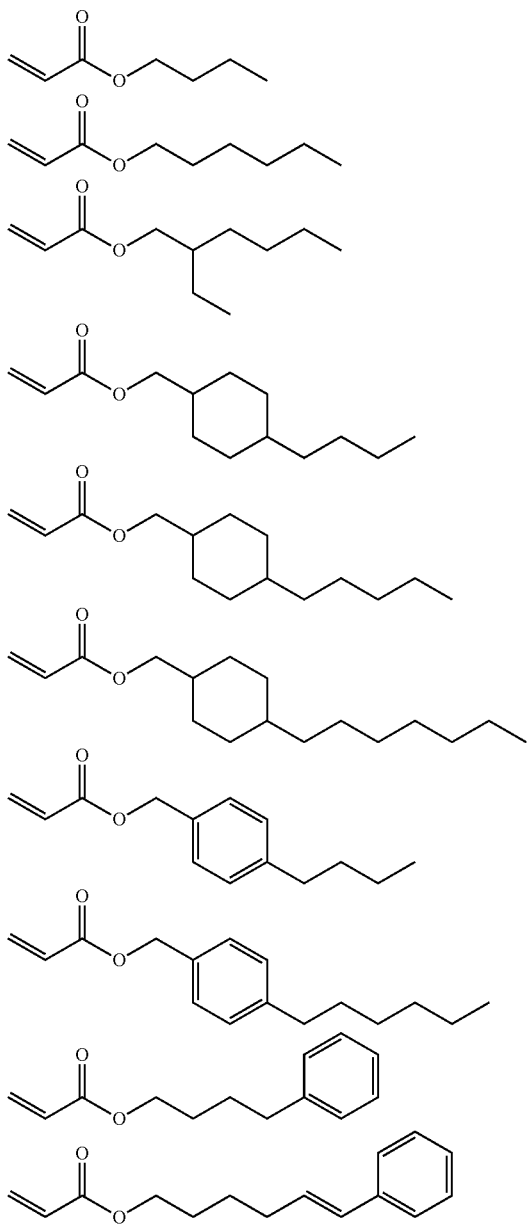

The preferred second embodiment of the monofunctional polymerizable compound used in the curable composition for imprinting is a compound having a cyclic structure. The cyclic structure is preferably a 3- to 8-membered monocyclic ring or a fused ring. The number of rings constituting the above-described fused ring is preferably 2 or 3. The cyclic structure is more preferably a 5- to 6-membered ring and still more preferably a 6-membered ring. In addition, a monocyclic ring is more preferable.

The number of cyclic structures in a molecule of a polymerizable compound may be 1 or 2 or more, but is preferably 1 or 2 and more preferably 1. In a case of a fused ring, the fused ring is considered as a cyclic structure.

Examples of the monofunctional polymerizable compound of the second embodiment include the following compounds. However, it goes without saying that the present invention is not limited thereto.

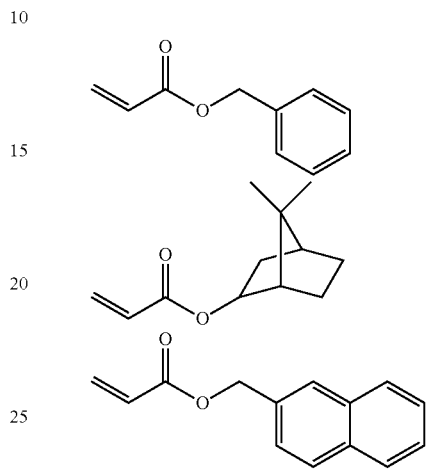

In the present invention, a monofunctional polymerizable compound other than the above-described monofunctional polymerizable compound may be used as long as it does not depart from the gist of the present invention. An example thereof includes a monofunctional polymerizable compound among the polymerizable compounds disclosed in JP2014-170949A, and the contents thereof are included in the present specification.

In a case where the curable composition for imprinting contains a monofunctional polymerizable compound, the content of the monofunctional polymerizable compound used in the curable composition for imprinting with respect to the total polymerizable compound in the curable composition for imprinting is preferably greater than or equal to 6 mass %, more preferably greater than or equal to 8 mass %, still more preferably greater than or equal to 10 mass %, and particularly preferably greater than or equal to 12 mass %. In addition, the above-described content is preferably less than or equal to 60 mass %, and may be less than or equal to 55 mass %.

Only one kind or two or more kinds of monofunctional polymerizable compounds may be contained in the present invention. In a case where the curable composition for imprinting contains two or more kinds of monofunctional polymerizable compounds, the total amount is preferably within the above-described ranges.

On the other hand, the polyfunctional polymerizable compound used in the curable composition for imprinting is not particularly limited, but preferably contains at least one of an alicyclic ring and an aromatic ring and more preferably contains an aromatic ring. In some cases, a compound containing at least one of an alicyclic ring and an aromatic ring may be referred to as a ring-containing polyfunctional polymerizable compound in the description below. By using the ring-containing polyfunctional polymerizable compound in the present invention, it is possible to more effectively suppress etching processing characteristics, particularly breakage of a pattern after etching. It is estimated that this is because an etching selection ratio with a processing object (for example, Si, Al, Cr, or an oxide thereof) in a case of etching processing improves.

The molecular weight of the ring-containing polyfunctional polymerizable compound used in the curable composition for imprinting is preferably less than or equal to 1,000, more preferably less than or equal to 800, still more preferably less than or equal to 500, and still more preferably less than or equal to 350. In a case where the upper limit value of the molecular weight is set to be less than or equal to 1,000, there is a tendency that it is possible to reduce the viscosity.

The lower limit value of the molecular weight is not particularly specified, but the molecular weight can be set, for example, to be greater than or equal to 200.

The number of polymerizable groups contained in the ring-containing polyfunctional polymerizable compound used in the curable composition for imprinting is 2 or more, preferably 2 to 7, more preferably 2 to 4, still more preferably 2 or 3, and particularly preferably 2.

The kind of polymerizable group included in the ring-containing polyfunctional polymerizable compound used in the curable composition for imprinting is not particularly specified, but is, for example, an ethylenically unsaturated bond-containing group and an epoxy group and preferably an ethylenically unsaturated bond-containing group. Examples of the ethylenically unsaturated bond-containing group include a (meth)acryloyl group and a vinyl group, more preferably a (meth)acryloyl group, and still more preferably an acryloyl group. In addition, the (meth)acryloyl group is preferably a (meth)acryloyloxy group. Two or more kinds of polymerizable groups may be contained in one molecule, or two or more polymerizable groups of the same kind may be contained therein.

The kinds of atoms constituting the ring-containing polyfunctional polymerizable compound used in the curable composition for imprinting is not particularly specified, but the monofunctional polymerizable compound thereof is preferably constituted of only atoms selected from carbon atoms, oxygen atoms, hydrogen atoms, and halogen atoms, and is more preferably constituted of only atoms selected from carbon atoms, oxygen atoms, and hydrogen atoms.

The ring contained in the ring-containing polyfunctional polymerizable compound used in the curable composition for imprinting may be a monocyclic ring or a condensed ring, but it is preferably a monocyclic ring. In a case where the ring thereof is a condensed ring, the number of rings is preferably 2 or 3. The ring is preferably a 3- to 8-membered ring, more preferably a 5- to 6-membered ring, and still more preferably a 6-membered ring. In addition, the ring may be an alicyclic ring or an aromatic ring, but is preferably an aromatic ring. Specific examples of the ring include a cyclohexane ring, a norbornane ring, an isobornane ring, a tricyclodecane ring, a tetracyclododecane ring, an adamantane ring, a benzene ring, a naphthalene ring, an anthracene ring, and a fluorene ring, among which a cyclohexane ring, a tricyclodecane ring, an adamantane ring, and a benzene ring are more preferable and a benzene ring is still more preferable.

The number of rings in the ring-containing polyfunctional polymerizable compound used in the curable composition for imprinting may be 1 or 2 or more, but is preferably 1 or 2 and more preferably 1. In a case of a condensed ring, it is considered that the number of condensed rings is 1.

The ring-containing polyfunctional polymerizable compound used in the curable composition for imprinting is preferably represented by (polymerizable group)—(single bond or divalent linking group)—(divalent group having ring)—(single bond or a divalent linking group)—(polymerizable group). Here, as the linking group, an alkylene group is more preferable, and an alkylene group having 1 to 3 carbon atoms is more preferable.

The ring-containing polyfunctional polymerizable compound used in the curable composition for imprinting is preferably represented by Formula (1).

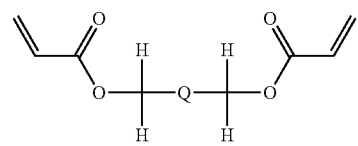

In Formula (1), Q represents a divalent group having an alicyclic ring or an aromatic ring.

The preferred range of an alicyclic ring or an aromatic ring in Q is the same as the above.

Examples of the polyfunctional polymerizable compound used in the curable composition for imprinting include the following first group and second group. However, it goes without saying that the present invention is not limited thereto. The first group is more preferable.

First Group

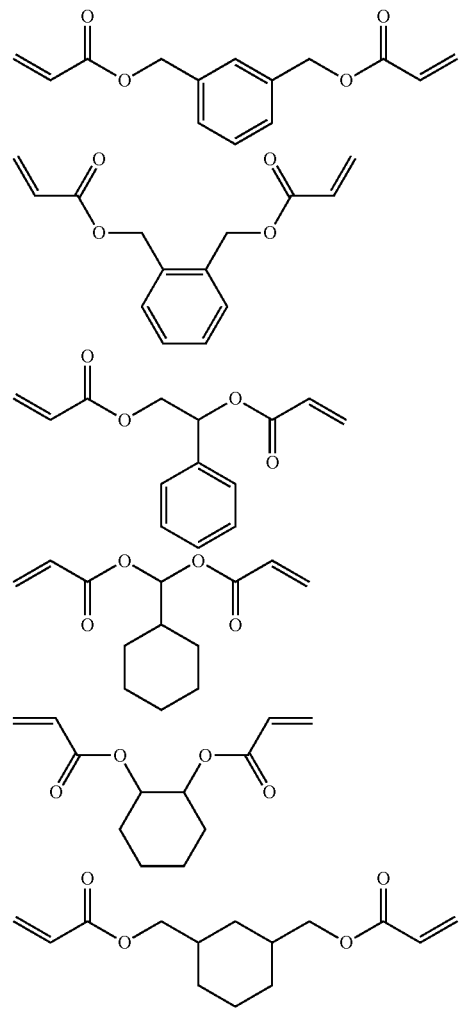

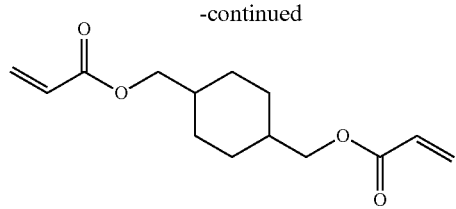

Second Group

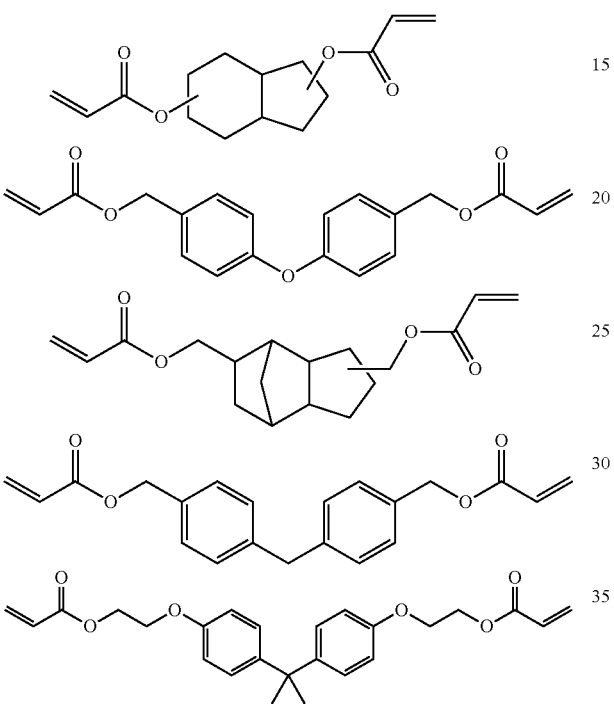

The curable composition for imprinting may contain other polyfunctional polymerizable compounds besides the above-described ring-containing polyfunctional polymerizable compound.

Examples of the other polyfunctional polymerizable compounds used in the curable composition for imprinting include polyfunctional polymerizable compounds having no ring among the polymerizable compounds disclosed in JP2014-170949A, and the contents thereof are included in the present specification. More specifically, for example, the following compounds are exemplified.

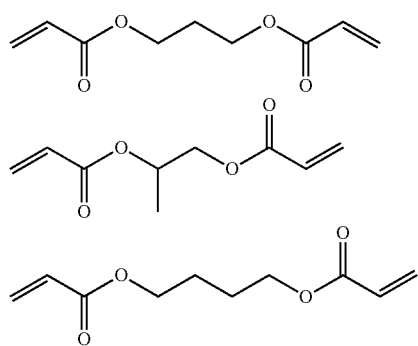

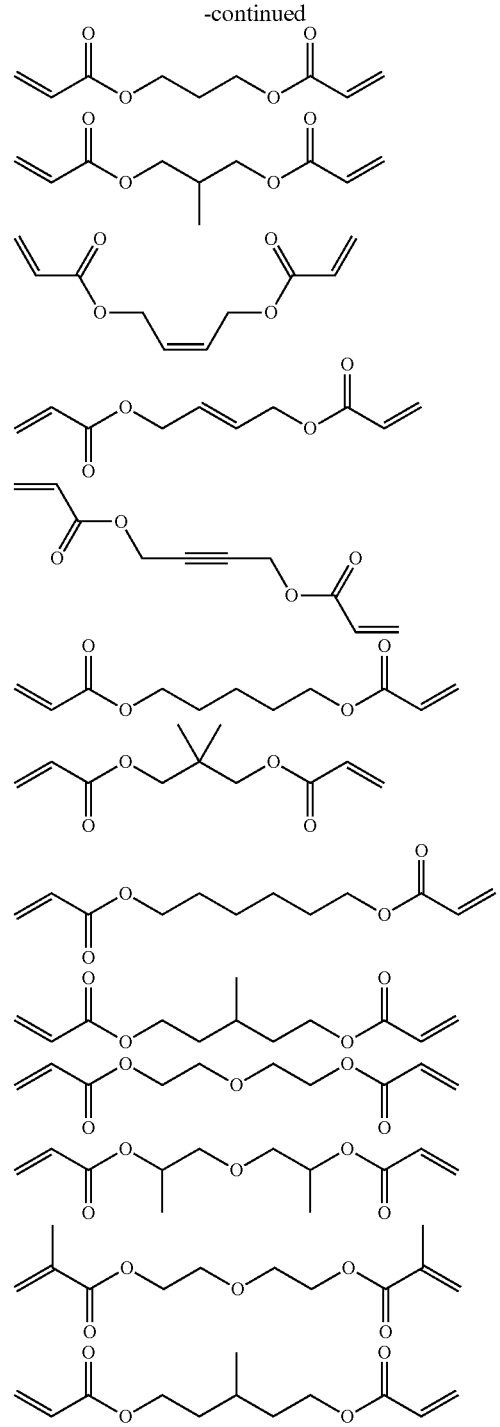

The polyfunctional polymerizable compound with respect to the total polymerizable compound is preferably contained in the curable composition for imprinting in an amount of greater than or equal to 30 mass %, more preferably greater than or equal to 45 mass %, still more preferably greater than or equal to 50 mass %, and still more preferably greater than or equal to 55. The polyfunctional polymerizable compound may be contained therein in an amount of greater than or equal to 60 mass % or an amount of greater than or equal to 70 mass %. In addition, the upper limit value is preferably less than 95 mass %, more preferably less than or equal to 90 mass %, and can also be set to be less than or equal to 85 mass %. By particularly setting the content of the above-described ring-containing polyfunctional polymerizable compound to be greater than or equal to 30 mass % of the total polymerizable compound, the etching selection ratio with a processing object (for example, Si, Al, Cr, or an oxide thereof) in a case of etching processing improves, and therefore, it is possible to suppress breakage of a pattern after etching processing.

The curable composition for imprinting may contain only one kind of polyfunctional polymerizable compound or two or more kinds of polyfunctional polymerizable compounds. In a case where the curable composition for imprinting contains two or more kinds of polyfunctional polymerizable compounds, the total amount is preferably within the above-described ranges.

In the curable composition for imprinting used in the present invention, it is preferable that greater than or equal to 85 mass % of the composition is the polymerizable compound, it is more preferable that greater than or equal to 90 mass % of the composition is the polymerizable compound, and it is still more preferable that greater than or equal to 93 mass % of the composition is the polymerizable compound.

<Other Components>

The curable composition for imprinting may contain an additive other than the polymerizable compound. An example of the other additive includes a photopolymerization initiator. Furthermore, the curable composition for imprinting may contain a sensitizer, a releasing agent, an antioxidant, a polymerization inhibitor, a solvent, and the like.

Each component disclosed in JP2013-036027A, JP2014-090133A, and JP2013-189537A can be used as a photopolymerization inhibitor, a sensitizer, a releasing agent, an antioxidant, a polymerization inhibitor, a solvent, and the like in addition to components to be described in examples below. The disclosures of the above-described gazettes can also be referred to for the content and the like.

Specific examples of the curable composition for imprinting that can be used in the present invention include compositions to be described in examples below, and compositions disclosed in JP2013-036027A, JP2014-090133A, and JP2013-189537A, and the contents thereof are incorporated into the present specification. In addition, the disclosures of the above-described publications can also be referred to for a method for preparing a curable composition for imprinting and forming a method for forming a film (pattern forming layer), and the contents thereof are incorporated into the present specification.

It is possible to use a well-known storage container in the related art as a storage container of the curable composition for forming an adhesive film used in the present invention. In addition, it is preferable to use a multilayer bottle obtained by forming the inner wall of a container with 6 types and 6 layers of resins or a bottle obtained by forming 6 kinds of resins into a 7-layer structure as the storage container in order to suppress mixing of impurities into a raw material or a composition. Examples of such a container include containers disclosed in JP-2015-123351A.

EXAMPLES

Hereinafter, the present invention will be more specifically described with reference to examples. The material, the usage, the proportion, treatment contents, a treatment procedure, and the like shown in Examples below can be appropriately changed without departing from the gist of the present invention. Accordingly, the range in the present invention is not limited to specific examples shown below.

Synthesis Example 1

Synthesis of Intermediate of Resin A-1

Propylene glycol 1-monomethyl ether 2-acetate (PGMEA) (32.4 g) was added to a 1 L three-neck flask, into which nitrogen ($N_2$) is flowing, and heated to 90° C. A mixture obtained by dissolving BLEMMER GS (7.1 g (49.9 mmol) manufactured by NOF CORPORATION), BLEMMER PME-400 (24.8 g (49.9 mmol) manufactured by NOF CORPORATION), and V-601 (1.0 g (4.3 mmol) of a photoradical polymerization initiator manufactured by Wako Pure Chemical Industries, Ltd.) in PGMEA (32.4 g) was added dropwise to the flask for 2 hours at a temperature at which the internal temperature of the above-described flask does not exceed 95° C., and the mixture was aged for 4 hours at 90° C. Thereafter, the mixture was cooled to 25° C. Diisopropyl ether (DIPE) (435.5 g) and isopropyl alcohol (IPA) (186.6 g) were added to another 1 L three-neck flask, and the mixture was cooled to −20° C. and stirred. The reaction liquid of the above-described flask was added dropwise thereto over 30 minutes at a temperature not exceeding −15° C., and stirred for 1 hour. Thereafter, it was allowed to stand for 1 hour, and a supernatant was removed. A desired intermediate was synthesized by drying the obtained viscous liquid under reduced pressure.

Synthesis of Resin A-1

An intermediate (25.9 g (81.1 mmol)) of a resin A-1 and PGMEA (77.6 g) were added to a 1 L three-neck flask, into which nitrogen ($N_2$) is flowing, and dissolved. Acrylic acid (3.2 g (44.4 mmol)), tetraethylammonium bromide (TEAB, 0.6 g (2.9 mmol)), and 4-hydroxy-2,2,6,6-tetramethylpiperidine-1-oxyl free radical (4-OH-TEMPO, 0.026 g (0.15 mmol)) were added to the above-described flask, and the mixture was aged for 8 hours at 90° C. Thereafter, the mixture was cooled to 25° C. DIPE (100 g), IPA (443 g), and a distilled water (23 g) were added to another 1 L three-neck flask, and the mixture was cooled to −20° C. and stirred. The reaction liquid of the above-described flask was added dropwise thereto over 30 minutes at a temperature not exceeding −15° C., and stirred for 1 hour. Thereafter, it was allowed to stand for 1 hour, and a supernatant was removed. A target resin was synthesized by drying the obtained viscous liquid under reduced pressure.

The weight-average molecular weight of the obtained resin A-1 was 25,000.

Synthesis Example 2

Resins A-2 to A-23 and resins H-1 to H-4 were synthesized according to Synthesis Example 1.

<Other Raw Materials>

Resin A-24: CA-320S NF/EP manufactured by Eastman Chemical Company

Compound B-1: M-550 manufactured by NOF CORPORATION

Structures of each resin and compound are shown below. The molar ratio of a left side repeating unit to a right side repeating unit in all the resins A-1, A-2, A-4 to A-14, A-24, H-1, and H-2 is 50:50. Furthermore, the molar ratio of a left side repeating unit to a central repeating unit to a right side repeating unit of the resin A-23 is 40:50:10.

* is a bonding site to another repeating unit. In addition, each n is an average value.

Resin A-1
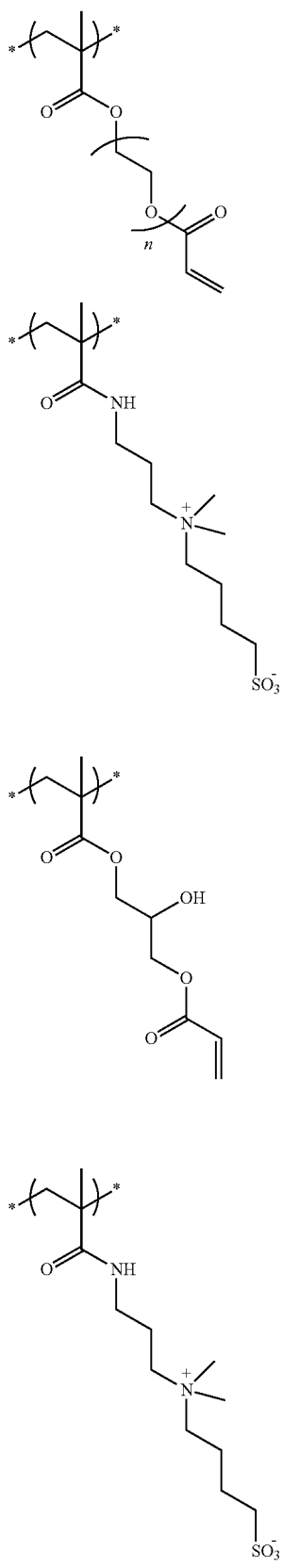
In the above-described resin A-1, n is 8.
Resin A-3
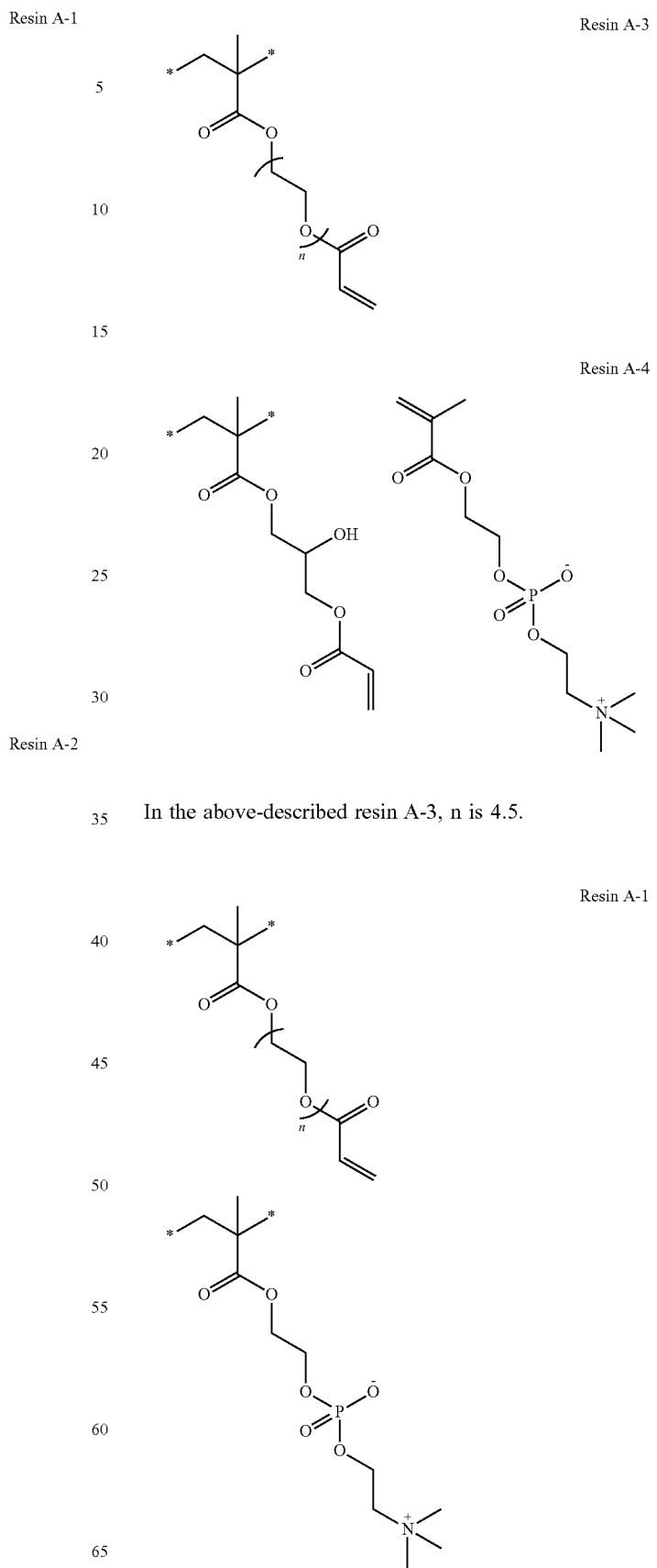
In the above-described resin A-3, n is 4.5.

Resin A-6
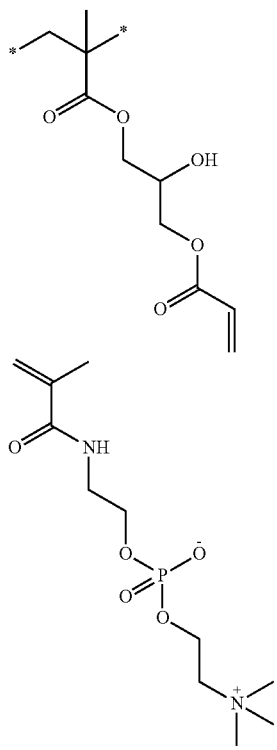
Resin A-7
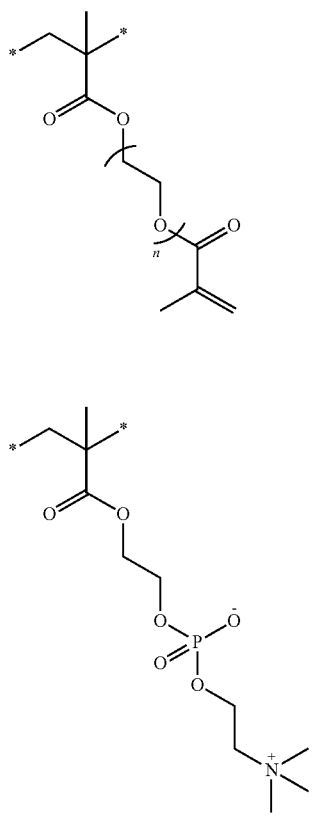
In the above-described resin A-5, n is 2. In the above-described resin A-7, n is 8.
Resin A-8
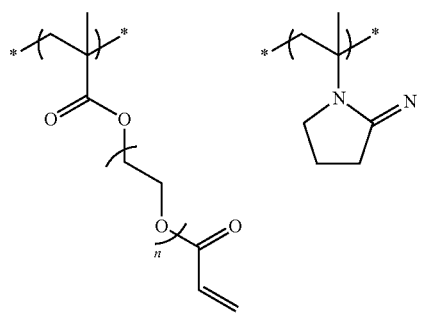
Resin A-9
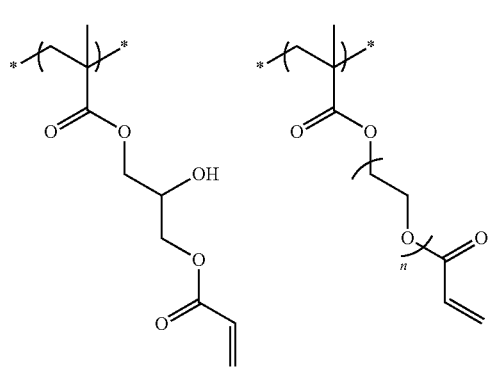
In the above-described resin A-8, n is 12.
In the above-described resin A-9, n is 12.
Resin A-10
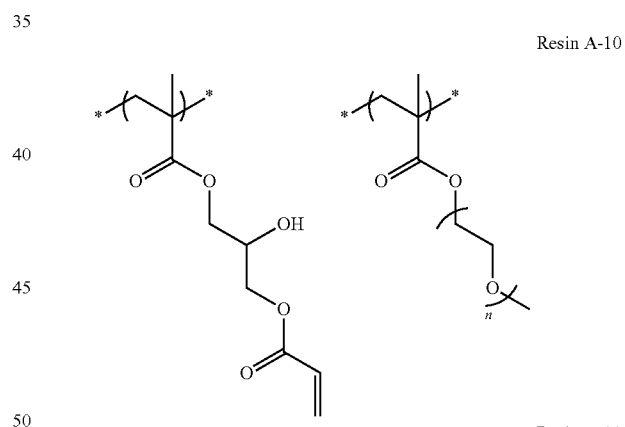
Resin A-11
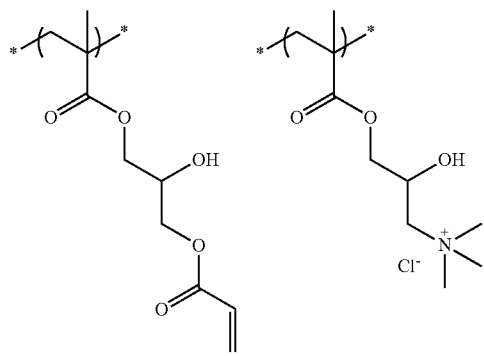
In the above-described resin A-10, n is 90.

Resin A-12
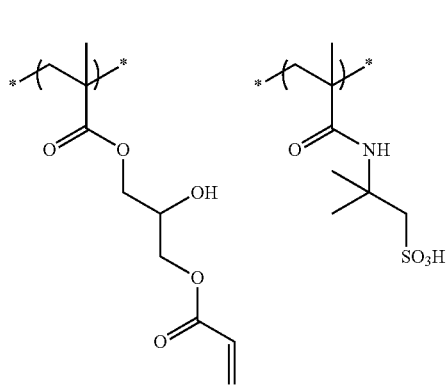
Resin A-13
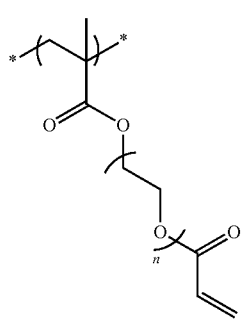
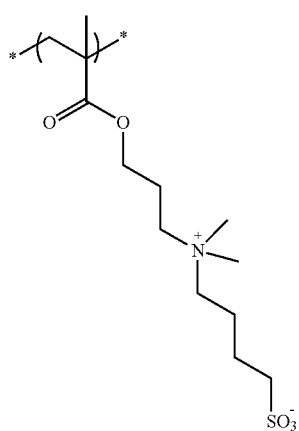
Resin A-14
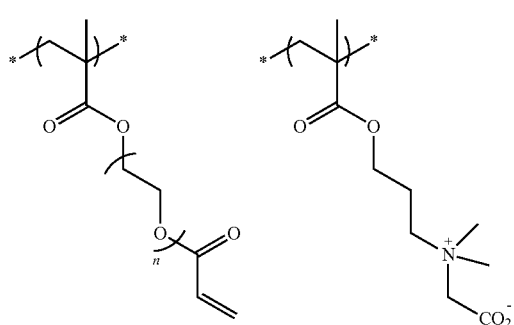
In the above-described resin A-13, n is 8.
In the above-described resin A-14, n is 4.5.
Resin A-15
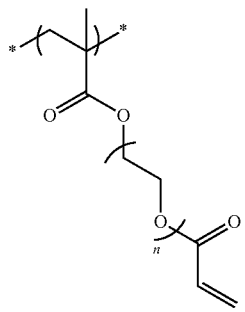
Resin A-16
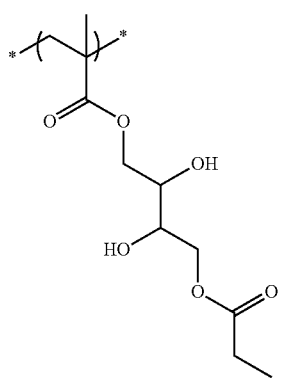
Resin A-17
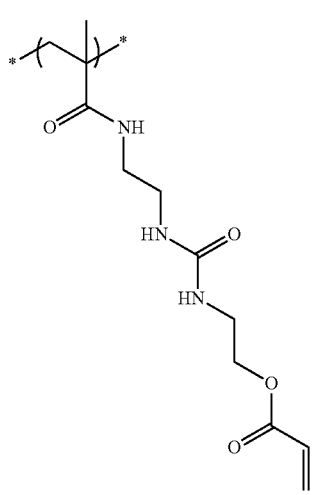
In the above-described resin A-15, n is 12.
Resin A-18
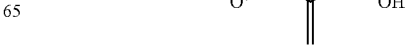

Resin A-19
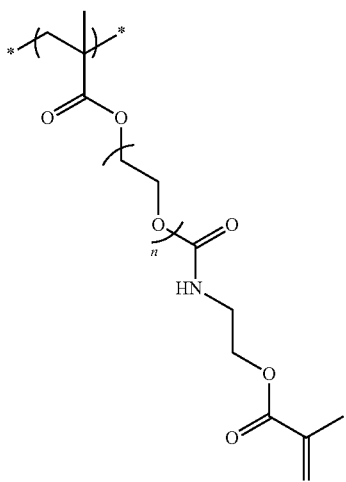
In the above-described resin A-19, n is 13.2.
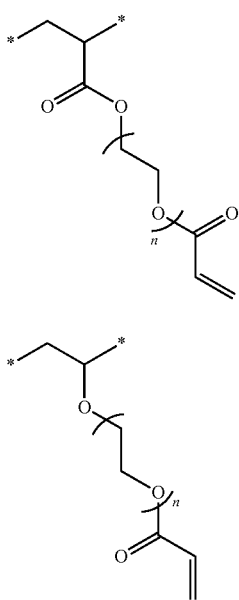
Resin A-20
Resin A-21
In the above-described resin A-20, n is 10.
In the above-described resin A-21, n is 10.
Resin A-22
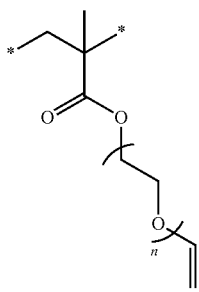
Resin A-23
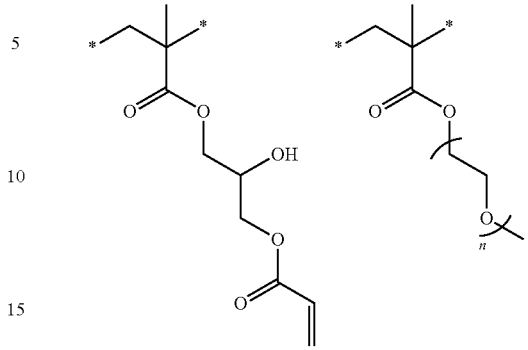
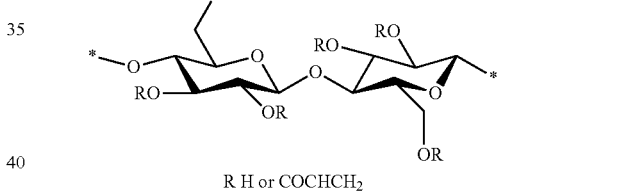
Resin A-24
R H or COCHCH$_2$
In the above-described resin A-22, n is 8.
In the above-described resin A-23, n is 23.
In the above-described resin A-24, the proportion of H among R's is 66.7 mol %.
Resin A-25
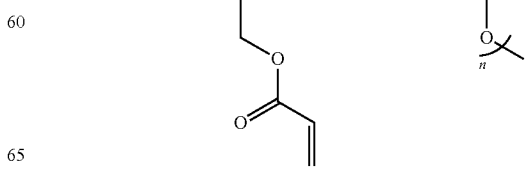

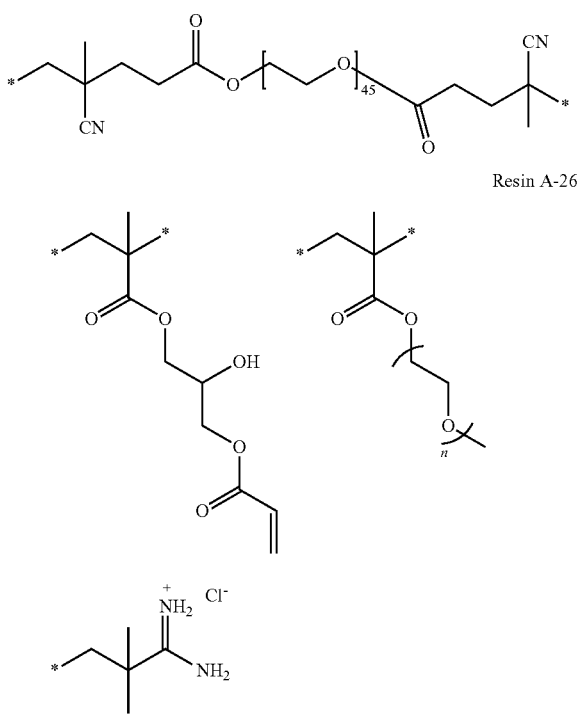

Resin A-26

In the above-described resin A-25, n is 90. In addition, the molar ratio of a left side repeating unit to a central repeating unit to a right side repeating unit is 80:10:10. In the above-described resin A-26, n is 90. In addition, the molar ratio of a left side repeating unit to a right side repeating unit is 60:40. The resin has a group consisting of an anion and a cation at a terminal.

Compound B-1

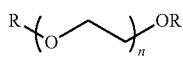

R = H or CH₃

In the compound B-1, R is a methyl group. n is 11.8.

The C log P value of the compound as a raw material of the above-described compound B-1 is −2.0.

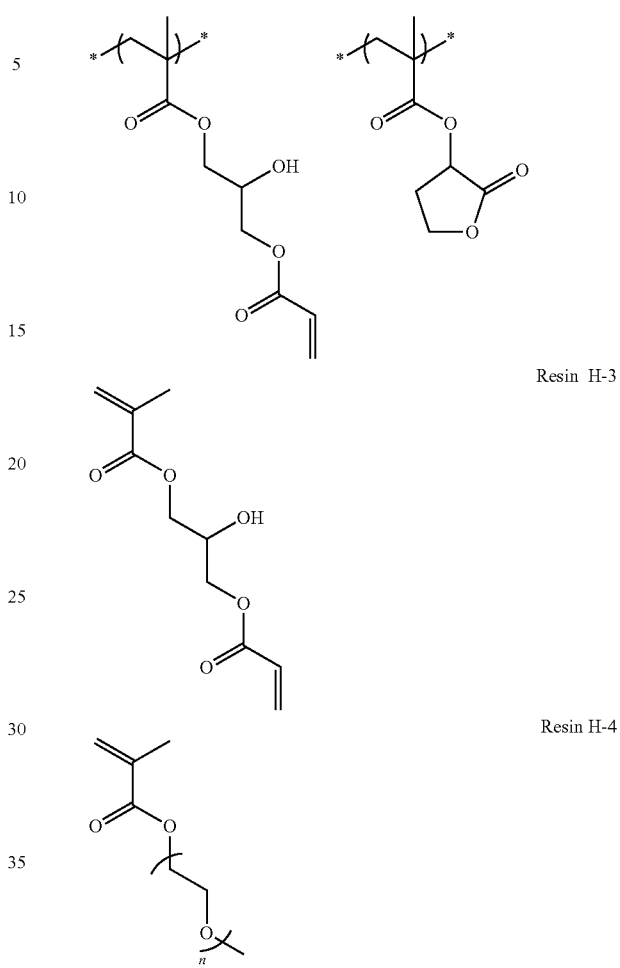

In the above-described resin H-4, n is 23.

\<Solvent\>
PGMEA: Propylene glycol monomethyl ether acetate
PGME: Propylene glycol monomethyl ether
Water \<C log P Value\>
The C log P value was calculated using SOFTWARE PACKAGE 2 (Chem Bio Draw Ultra Ver. 13.0.2.3021 (Cambridge Soft Corporation, USA)).

\<Solubility in Water at 25° C.\>
The solubility in water at 25° C. was measured for each resin. The solubility was divided as follows.
A: 1 mass %
B: 1 mass %>Solubility 0.1 mass %
C: <0.1 mass %

The above-described results are shown in Table 1 below.

TABLE 1

| | Solubility in water at 25° C. | ClogP value of polymerizable compound constituting repeating unit | | |
|---|---|---|---|---|
| | | Left side | Center | Right side |
| Resin A-1 | A | 0.7 | — | −9.5 |
| Resin A-2 | A | 0.8 | — | −9.5 |
| Resin A-3 | A | 0 | — | — |

TABLE 1-continued

| | Solubility in water at 25° C. | ClogP value of polymerizable compound constituting repeating unit | | |
|---|---|---|---|---|
| | | Left side | Center | Right side |
| Resin A-4 | A | 0.8 | — | −9.9 |
| Resin A-5 | A | 1.7 | — | −9.9 |
| Resin A-6 | A | 0.8 | — | −9.9 |
| Resin A-7 | A | 1 | — | −9.9 |
| Resin A-8 | A | 0 | — | 0.4 |
| Resin A-9 | A | 0.8 | — | 0 |
| Resin A-10 | A | 0.8 | — | Cannot be calculated * |
| Resin A-11 | A | 0.8 | — | −3.5 |
| Resin A-12 | A | 0.8 | — | −1.2 |
| Resin A-13 | A | 0.7 | — | −9.5 |
| Resin A-14 | A | 1.2 | — | −5.8 |
| Resin A-15 | A | 0 | — | — |
| Resin A-16 | A | 0 | — | — |
| Resin A-17 | A | −0.5 | — | — |
| Resin A-18 | A | −0.2 | — | — |
| Resin A-19 | A | 0 | — | — |
| Resin A-20 | A | 0 | — | — |
| Resin A-21 | A | −0.5 | — | — |
| Resin A-22 | A | 0 | — | — |
| Resin A-23 | A | 0 | −2.8 | −9.5 |
| Resin A-24 | A | 0 | — | — |
| Resin A-25 | A | 0.8 | Cannot be calculated * | Cannot be calculated * |
| Resin A-26 | A | 0.8 | Cannot be calculated * | — |
| Resin H-1 | B | 0.8 | — | 0.3 |
| Resin H-2 | C | 0.8 | — | 0 |
| Resin H-3 | C | 0.8 | — | — |
| Resin H-4 | A | −2.8 | — | — |

The value in the * section of the resin A-10 was less than or equal to −7.0, and therefore, could not be calculated.

In Table 1, the left side means a repeating unit described on the most left side in the resins A-1 to H-4. In a case where there is one kind of repeating unit, only the left side column was described. In a case where there are two kinds of repeating units, only the left and right side column were described.

<Weight-Average Molecular Weight>
The weight-average molecular weight was measured under the following conditions.
1. Column
Manufactured by TOSOH CORPORATION
TSK guard column MP (XL) (#M0019)
TSK gel Multipore Hxl-M (#M0072)
TSK gel Multipore Hxl-M (#M0071)
TSK gel Multipore Hxl-M (#M0070)
2. Temperature: 40° C.
3. Development solvent and concentration: 100% Tetrahydrofuran (THF)
4. Flow rate of development solvent
Sample pump: 1.00 mL/minute
Reference pump: 0.33 mL/minute
5. Detector: infrared rays (IR)
<Measurement Conditions>
Recorder range: 256 uRIU
Recorder balance: 0%
Polarity: positive (+)
Intensity balance: 0%
Intensity range: 256 uRIU
Response: 0.5 seconds
Temperature: 40° C.
6. Injection amount: 10 μL
7. Device: HLC-8320 GPC manufactured by TOSOH CORPORATION
8. Sample diluent: Tetrahydrofuran (THF)
9. Sample concentration: 0.5 mass %
10. Calibration curve base resin: TSK standard POLYSTYRENE Mol. Wt.; 1,090,000, 355,000, 186,000, 96,400, 37,900, 16,700, 10,200, 5,570, 2,630, 1,010, 590, 580, 578, 474, and 370 manufactured by TOSOH CORPORATION <Preparation of Composition for Forming Adhesive Film for Imprinting>
As described in Tables 2 to 4, components are blended with each other and filtered with a 0.1 μm polytetrafluoroethylene (PTFE) filter to prepare each composition for forming an adhesive film for imprinting shown in examples and comparative examples.

TABLE 2

| | Weight-average molecular weight | Example 1-1 | Example 1-2 | Example 1-3 | Example 1-4 | Example 1-5 | Example 1-6 | Example 1-7 | Example 1-8 | Example 1-9 | Example 1-10 | Example 1-11 |
|---|---|---|---|---|---|---|---|---|---|---|---|---|
| Resin A-1 (parts by mass) | 10,000 | 10.0 | | | | | | | | | | |
| Resin A-2 (parts by mass) | 10,000 | | 10.0 | | | | | | | | | |
| Resin A-3 (parts by mass) | 7,000 | | | 10.0 | | | | | | | | |
| Resin A-4 (parts by mass) | 9,000 | | | | 10.0 | | | | | | | |
| Resin A-5 (parts by mass) | 15,000 | | | | | 10.0 | | | | | | |
| Resin A-6 (parts by mass) | 15,000 | | | | | | 10.0 | | | | | |
| Resin A-7 (parts by mass) | 12,000 | | | | | | | 10.0 | | | | |
| Resin A-8 (parts by mass) | 8,000 | | | | | | | | 10.0 | | | |
| Resin A-9 (parts by mass) | 9,000 | | | | | | | | | 10.0 | | |
| Resin A-10 (parts by mass) | 15,000 | | | | | | | | | | 10.0 | |
| Resin A-11 (parts by mass) | 20,000 | | | | | | | | | | | 10.0 |
| Resin A-12 (parts by mass) | 9,000 | | | | | | | | | | | |
| Resin A-13 (parts by mass) | 120,000 | | | | | | | | | | | |
| Resin A-14 (parts by mass) | 45,000 | | | | | | | | | | | |
| Resin A-15 (parts by mass) | 6,000 | | | | | | | | | | | |
| Resin A-16 (parts by mass) | 10,000 | | | | | | | | | | | |
| Resin A-17 (parts by mass) | 10,000 | | | | | | | | | | | |
| Resin A-18 (parts by mass) | 5,000 | | | | | | | | | | | |
| Resin A-19 (parts by mass) | 9,000 | | | | | | | | | | | |
| Resin A-20 (parts by mass) | 9,000 | | | | | | | | | | | |
| Resin A-21 (parts by mass) | 150,000 | | | | | | | | | | | |
| Resin A-22 (parts by mass) | | | | | | | | | | | | |
| Resin A-23 (parts by mass) | | | | | | | | | | | | |
| Resin A-24 (parts by mass) | | | | | | | | | | | | |

TABLE 2-continued

| | Weight-average molecular weight | Example 1-1 | Example 1-2 | Example 1-3 | Example 1-4 | Example 1-5 | Example 1-6 | Example 1-7 | Example 1-8 | Example 1-9 | Example 1-10 | Example 1-11 |
|---|---|---|---|---|---|---|---|---|---|---|---|---|
| Compound B-1 (parts by mass) | — | | | | | | | | | | | |
| Resin H-1 (parts by mass) | 10,000 | | | | | | | | | | | |
| Resin H-2 (parts by mass) | 8,000 | | | | | | | | | | | |
| Resin H-3 (parts by mass) | 15,000 | | | | | | | | | | | |
| Resin H-4 (parts by mass) | 10,000 | | | | | | | | | | | |
| PGMEA | — | | | | | | | | | 90.0 | 90.0 | 90.0 | |
| PGME | — | 45.0 | 45.0 | 45.0 | 45.0 | 45.0 | 45.0 | 45.0 | | | | 45.0 |
| Water | — | 45.0 | 45.0 | 45.0 | 45.0 | 45.0 | 45.0 | 45.0 | | | | 45.0 |

TABLE 3

| | Weight-average molecular weight | Example 1-12 | Example 1-13 | Example 1-14 | Example 1-15 | Example 1-16 | Example 1-17 | Example 1-18 | Example 1-19 | Example 1-20 | Example 1-21 | Example 1-22 |
|---|---|---|---|---|---|---|---|---|---|---|---|---|
| Resin A-1 (parts by mass) | 10,000 | | | | | | | | | | | |
| Resin A-2 (parts by mass) | 10,000 | | | | | | | | | | | |
| Resin A-3 (parts by mass) | 7,000 | | | | | | | | | | | |
| Resin A-4 (parts by mass) | 9,000 | | | | | | | | | | | |
| Resin A-5 (parts by mass) | 15,000 | | | | | | | | | | | |
| Resin A-6 (parts by mass) | 15,000 | | | | | | | | | | | |
| Resin A-7 (parts by mass) | 12,000 | | | | | | | | | | | |
| Resin A-8 (parts by mass) | 8,000 | | | | | | | | | | | |
| Resin A-9 (parts by mass) | 9,000 | | | | | | | | | | | |
| Resin A-10 (parts by mass) | 15,000 | | | | | | | | | | | |
| Resin A-11 (parts by mass) | 20,000 | | | | | | | | | | | |
| Resin A-12 (parts by mass) | 9,000 | 10.0 | | | | | | | | | | |
| Resin A-13 (parts by mass) | 120,000 | | 10.0 | | | | | | | | | |
| Resin A-14 (parts by mass) | 45,000 | | | 10.0 | | | | | | | | |
| Resin A-15 (parts by mass) | 6,000 | | | | 10.0 | | | | | | | |
| Resin A-16 (parts by mass) | 10,000 | | | | | 10.0 | | | | | | |
| Resin A-17 (parts by mass) | 10,000 | | | | | | 10.0 | | | | | |
| Resin A-18 (parts by mass) | 5,000 | | | | | | | 10.0 | | | | |
| Resin A-19 (parts by mass) | 9,000 | | | | | | | | 10.0 | | | |
| Resin A-20 (parts by mass) | 9,000 | | | | | | | | | 9.0 | | |
| Resin A-21 (parts by mass) | 150,000 | | | | | | | | | | 10.0 | |
| Resin A-22 (parts by mass) | | | | | | | | | | | | 9.0 |
| Resin A-23 (parts by mass) | | | | | | | | | | | | |
| Resin A-24 (parts by mass) | | | | | | | | | | | | |
| Compound B-1 (parts by mass) | — | | | | | | | | | | | |
| Resin H-1 (parts by mass) | 10,000 | | | | | | | | | | | |
| Resin H-2 (parts by mass) | 8,000 | | | | | | | | | | | |
| Resin H-3 (parts by mass) | 15,000 | | | | | | | | | 1.0 | | 1.0 |
| Resin H-4 (parts by mass) | 10,000 | | | | | | | | | | | |
| PGMEA | — | 90.0 | | | 90.0 | 90.0 | | 90.0 | | 45.0 | | |
| PGME | — | | 45.0 | 45.0 | | | 45.0 | | 45.0 | 50.0 | 50.0 | 90.0 |
| Water | — | | 45.0 | 45.0 | | | 45.0 | | | 40.0 | 40.0 | |

TABLE 4

| | Weight-average molecular weight | Example 1-23 | Example 1-24 | Example 1-25 | Example 1-26 | Example 1-27 | Example 1-28 | Example 1-29 | Example 1-30 | Example 1-31 | Comparative Example 1-1 | Comparative Example 1-2 | Comparative Example 1-3 | Comparative Example 1-4 |
|---|---|---|---|---|---|---|---|---|---|---|---|---|---|---|
| Resin A-1 (parts by mass) | 10,000 | | | | | | | | | | | | | |
| Resin A-2 (parts by mass) | 10,000 | | | | | | | | | | | | | |
| Resin A-3 (parts by mass) | 7,000 | | | | | | | | | | | | | |
| Resin A-4 (parts by mass) | 9,000 | | | | | | | | | | | | | |
| Resin A-5 (parts by mass) | 15,000 | | | | | | | | | | | | | |
| Resin A-6 (parts by mass) | 15,000 | | | | | | | | | | | | | |
| Resin A-7 (parts by mass) | 12,000 | | | | | | | | | | | | | |
| Resin A-8 (parts by mass) | 8,000 | | | | | | | | | | | | | |
| Resin A-9 (parts by mass) | 9,000 | | | 5.0 | 1.0 | 0.1 | 9.0 | | | | | | | |
| Resin A-10 (parts by mass) | 15,000 | | | | | | | 9.0 | | | | | | |
| Resin A-11 (parts by mass) | 20,000 | | | | | | | | | | | | | |
| Resin A-12 (parts by mass) | 9,000 | | | | | | | | | | | | | |
| Resin A-13 (parts by mass) | 120,000 | | | | | | | | | | | | | |
| Resin A-14 (parts by mass) | 45,000 | | | | | | | | | | | | | |
| Resin A-15 (parts by mass) | 6,000 | | | | | | | | | | | | | |
| Resin A-16 (parts by mass) | 10,000 | | | | | | | | | | | | | |
| Resin A-17 (parts by mass) | 10,000 | | | | | | | | | | | | | |
| Resin A-18 (parts by mass) | 5,000 | | | | | | | | | | | | | |
| Resin A-19 (parts by mass) | 9,000 | | | | | | | | | | | | | |
| Resin A-20 (parts by mass) | 9,000 | | | | | | | | | | | | | |
| Resin A-21 (parts by mass) | 150,000 | | | | | | | | | | | | | |
| Resin A-22 (parts by mass) | 20,000 | | | | | | | | | | | | | |
| Resin A-23 (parts by mass) | 50,000 | 10.0 | | | | | | | | | | | | |
| Resin A-24 (parts by mass) | 100,000 | | 10.0 | | | | | | | | | | | |
| Resin A-25 (parts by mass) | 50,000 | | | | | | | | 0.5 | | | | | |
| Resin A-26 (parts by mass) | 40,000 | | | | | | | | | 0.1 | | | | |
| Compound B-1 (parts by mass) | — | | | | | | 1.0 | 1.0 | | | | | | |
| Resin H-1 (parts by mass) | 10,000 | | | | | | | | | | 10.0 | | | |
| Resin H-2 (parts by mass) | 8,000 | | | | | | | | | | | 10.0 | | |
| Resin H-3 (parts by mass) | 15,000 | | | | | | | | | | | | 100 | |
| Resin H-4 (parts by mass) | 10,000 | | | | | | | | | | | | | 10.0 |
| PGMEA | | | | | | | | | | | | | | |
| PGME | | 90.0 | 90.0 | 45.0 | 450 | 45.0 | 45.0 | 45.0 | 79.5 | 59.9 | 90.0 | 90.0 | 90.0 | 90.0 |
| Water | | | | 50.0 | 54.0 | 54.9 | 45.0 | 45.0 | | 10.0 | | | | |
| γ-butyrolactone | | | | | | | | | 20.0 | 30.0 | | | | |

The weight-average molecular weight in Tables 2 to 4 represents a weight-average molecular weight of each resin.

<Preparation of Curable Composition for Imprinting>

48 parts by mass of LIGHT ACRYLATE NP-A (neopentyl glycol diacrylate manufactured by KYOEISHA CHEMICAL Co., LTD.), 48 parts by mass of a following compound M-3, 2 parts by mass of Light ACRYLATE L-A (lauryl acrylate manufactured by KYOEISHA CHEMICAL Co., LTD.), and 2 parts by mass of IRGACURE 907 (manufactured by BASF SE) were mixed with each other as polymerizable compounds, and 4-hydroxy-2,2,6,6-tetramethylpiperidine-1-oxyl free radical (manufactured by Tokyo Chemical Industry Co., Ltd.) was added thereto as a polymerization inhibitor so as to become 200 mass ppm (0.02 mass %) with respect to the polymerizable compounds to prepare a mixture. The mixture was filtered with a 0.1 μm filter made of polytetrafluoroethylene (PTFE) to prepare a curable composition for imprinting V1.

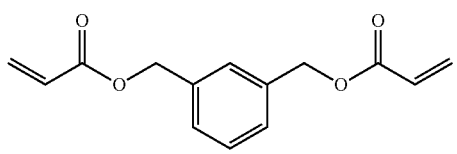

M-3

<Critical Surface Tension>

A substrate was spin-coated with a composition for forming an adhesive film which was then heated for 1 minute using a hot plate at 100° C. The composition for forming an adhesive film was further heated for 1 minute using a hot plate at 180° C. to form an adhesive film with a thickness of 5 nm.

The critical surface tension of the obtained adhesive film was measured.

2 μL of each solvent having different surface tensions was added dropwise to the surface of the adhesive film, and each contact angle θ at a point in time of 500 msec was measured after droplet impact. Results of the contact angles (θ) being greater than or equal to 2° were plotted on an xy plane (x: surface tension of solvent, y: cos θ calculated from the contact angle θ), linear functions approximating the above-described measurement results were calculated by a least-squares method, and extrapolation values of the above-described linear functions at cos θ being 1 were set as a critical surface tension (unit: mN/m) of the adhesive film.

Water (surface tension of 72.9 mN/m), glycerin (63.2), formamide (58.5), ethylene glycol (50.2), γ-butyrolactone (44.1), oleic acid (32.2), cyclohexanone (34.1), methyl acetate (25.0) were used as solvents.

The measurement of contact angles was performed at 25° C. using DMs-401 manufactured by Kyowa Interface Science Co., Ltd. Values after 500 msec after droplet impact were measured using n=3, and an average value thereof was set as a contact angle.

<Film Surface Condition>

The film surface condition of an adhesive film was evaluated as follows.

A 10 μm angle of the adhesive film obtained above was scanned using an atomic force microscope (AFM manufactured by Bruker AXS, Dimension Icon), and the arithmetic mean surface roughness (Ra) was measured. The results are shown in Table 5 below.

A: Ra<0.4 nm
B: 0.4 nm≤Ra

<Change in Film Thickness>

The change in film thickness of the adhesive film was evaluated as follows.

The film thickness of the adhesive film obtained above was measured immediately after the production of the adhesive film and after the lapse of 2 weeks at 25° C. using a reflective spectroscopic film thickness meter FE-3000 manufactured by OTSUKA ELECTRONICS Co., LTD.). The results are shown in Table 5 below.

<Adhesion Force>

The adhesion force between the substrate and the adhesive film was evaluated as follows.

Each of the surface of a spun-on carbon (SOC) film formed on a silicon wafer and the surface of a quartz wafer was spin-coated with the above-described composition for forming an adhesive film which was then heated for 1 minute on a hot plate fat 100° C. to dry the solvent. The composition for forming an adhesive film was hardened by further heating for 5 minutes on a hot plate at 180° C. to form an adhesive film. The thickness of the adhesive film after hardening was 5 nm.

A curable composition for imprinting V1 of which the temperature was adjusted to 25° C. was discharged on the surface of the adhesive film provided on the silicon wafer at an amount of liquid droplet of 1 pL per nozzle using an inkjet printer DMP-2831 manufactured by Fujifilm Dimatix, to coat the surface of the adhesive film so that liquid droplets are squarely arrayed at an interval of about 100 μm.

The quartz wafer was placed from the top so that the adhesive layer side comes into contact with the curable composition for imprinting, and exposure was performed from the quartz wafer using a high pressure mercury lamp under the condition of 300 mJ/cm². After the exposure, the quartz wafer was released, and the peeling force at that time was measured.

This peeling force corresponds to an adhesion force F (unit: N). The peeling force was measured according to the method for measuring a peeling force disclosed in comparative examples in paragraphs 0102 to 0107 of JP-2011-206977A. That is, the measurement was performed peeling steps 1 to 6 and 16 to 18 of FIG. 5 in the above-described gazette.

A: F≥45 N
B: 45 N >F≥20 N
C: 20 N>F

<Wettability>

The wettability of the curable composition for imprinting with respect to the adhesive film was measured according to the following method.

The surface of a spun-on carbon (SOC) film formed on a silicon wafer was spin-coated with the above-described composition for forming an adhesive film which was then heated for 1 minute on a hot plate at 100° C. to dry the solvent. The composition for forming an adhesive film was hardened by further heating for 5 minutes on a hot plate at 180° C. to form an adhesive film. The thickness of the adhesive film after hardening was 5 nm.

A curable composition for imprinting V1 of which the temperature was adjusted to 25° C. was discharged on the surface of the adhesive film provided on the silicon wafer at an amount of liquid droplet of 1 pL per nozzle using an inkjet printer DMP-2831 manufactured by Fujifilm Dimatix, to coat the surface of the adhesive film so that liquid droplets are squarely arrayed at an interval of about 100 µm. A contact angle θ 5 seconds after liquid deposition was measured.

A: θ≤3°
B: θ>3°

<Defects>

The defects of the obtained pattern were evaluated as follows.

The surface of a spin-on glass (SOG) film formed on a silicon wafer was spin-coated with the above-described composition for forming an adhesive film which was then heated for 1 minute on a hot plate fat 100° C. to dry the solvent. The composition for forming an adhesive film was hardened by further heating for 5 minutes on a hot plate at 180° C. to form an adhesive film. The thickness of the adhesive film after hardening was 5 nm.

A curable composition for imprinting V1 of which the temperature was adjusted to 25° C. was discharged on the surface of the adhesive film obtained above at an amount of liquid droplet of 1 pL per nozzle using an inkjet printer DMP-2831 manufactured by Fujifilm Dimatix, to coat the surface of the adhesive film so that liquid droplets are squarely arrayed at an interval of about 100 µm, and to make a pattern forming layer. Next, a quartz mold (rectangular line/space pattern (1/1), line width of 60 nm, groove depth of 100 nm, line edge roughness of 3.5 nm) was brought into press contact with the pattern forming layer, and the mold was filled with the pattern forming layer (curable composition for imprinting). A high pressure mercury lamp was used to perform an exposure from the mold side under the condition of 300 mJ/cm$^2$. Then, the mold was peeled off to transfer the pattern to the pattern forming layer.

The pattern transferred to the pattern forming layer was observed with an optical microscope STM6-LM manufactured by Olympus Corporation) to evaluate a peeling trouble of the pattern forming layer.

A: A peeling failure occurred in less than 1% of the total pattern area.

B: The peeling failure occurred in greater than or equal to 1% of the total pattern area.

TABLE 5

| | Critical surface tension | Film surface condition | Change in film thickness | Adhesion force between substrate and adhesive film | Adhesion force between adhesive film and cured product | Wettability | Defect |
|---|---|---|---|---|---|---|---|
| Example 1-1 | 48 | A | A | A | A | A | A |
| Example 1-2 | 47 | A | A | A | A | A | A |
| Example 1-3 | 45 | A | A | B | A | A | A |
| Example 1-4 | 47 | A | A | A | A | A | A |
| Example 1-5 | 47 | A | A | A | A | A | A |
| Example 1-6 | 47 | A | A | A | A | A | A |
| Example 1-7 | 47 | A | A | A | A | A | A |
| Example 1-8 | 46 | A | A | B | A | A | A |
| Example 1-9 | 46 | A | A | A | A | A | A |
| Example 1-10 | 46 | A | A | A | A | A | A |
| Example 1-11 | 47 | A | A | A | A | A | A |
| Example 1-12 | 46 | A | A | A | A | A | A |
| Example 1-13 | 47 | A | A | A | A | A | A |
| Example 1-14 | 47 | A | A | A | A | A | A |
| Example 1-15 | 45 | A | A | B | A | A | A |
| Example 1-16 | 45 | A | A | A | A | A | A |
| Example 1-17 | 46 | A | A | A | A | A | A |
| Example 1-18 | 46 | A | A | A | A | A | A |
| Example 1-19 | 46 | A | A | A | A | A | A |
| Example 1-20 | 45 | A | A | A | A | A | A |
| Example 1-21 | 46 | A | A | B | A | A | A |
| Example 1-22 | 46 | A | A | B | B | A | A |
| Example 1-23 | 46 | A | A | A | A | A | A |
| Example 1-24 | 46 | A | A | A | A | A | A |
| Example 1-25 | 48 | B | A | A | A | A | A |
| Example 1-26 | 48 | B | A | A | A | A | A |
| Example 1-27 | 49 | B | A | A | A | A | A |
| Example 1-28 | 49 | A | A | A | A | A | A |
| Example 1-29 | 49 | A | A | A | A | A | A |
| Example 1-30 | 50 | A | A | A | A | A | A |
| Example 1-31 | 50 | A | A | A | A | A | A |
| Comparative Example 1-1 | 44 | B | B | B | B | C | B |
| Comparative Example 1-2 | 44 | B | B | B | B | C | B |
| Comparative Example 1-3 | 45 | B | B | B | B | C | B |
| Comparative Example 1-4 | 46 | B | B | C | C | A | B |

As is as is apparent from the above-described results, the composition for forming an adhesive film of the present invention has an excellent film surface condition, little change in film thickness, excellent wettability, and an excellent adhesion force between a substrate and an adhesive film and between an adhesive film and a cured product, and less defects in an obtained pattern.

On the other hand, in a case where a resin was out of the ranges of the present invention, the wettability and the adhesion force between a substrate and an adhesive film and between an adhesive film and a cured product were inferior, and defects in an obtained pattern were recognized.

EXPLANATION OF REFERENCES

1: substrate
2: adhesive film
3: curable composition for imprinting
4: mold
21: adhesive film
22: curable composition for imprinting

What is claimed is:

1. A composition for forming an adhesive film for imprinting, the composition comprising:
   a resin (A) having a polymerizable group, said resin (A) having at least one kind of a repeating unit derived from a polymerizable compound having a ClogP value less than or equal to 0;
   at least one of a resin (B) which has a polymerizable group and does not have a repeating unit derived from a polymerizable compound having a ClogP value less than or equal to 0, and a resin (C) which does not have a polymerizable group and has a repeating unit derived from a polymerizable compound having a ClogP value less than or equal to 0; and
   a solvent,
   wherein solubility of the resin (A) in water at 25° C. is greater than or equal to 1 mass %, provided that the ClogP value is a coefficient showing affinity of an organic compound with respect to water and 1-octanol, the polymerizable compound has an -alkylene group-oxygen atom-structure, in which the alkylene group has 1 to 6 carbon atoms, and
   the number of repeating units of the -alkylene group-oxygen atom-structure is 2 to 90.

2. The composition for forming an adhesive film for imprinting according to claim 1,
   wherein the solvent is contained in the composition for forming an adhesive film for imprinting in a proportion of 85.0 to 99.9 mass %.

3. The composition for forming an adhesive film for imprinting according to claim 1,
   wherein the polymerizable group is a (meth)acrylic group.

4. The composition for forming an adhesive film for imprinting according to claim 1, further comprising:
   a non-polymerizable alkylene glycol compound.

5. The composition for forming an adhesive film for imprinting according to claim 1,
   wherein the solvent contains water.

6. The composition for forming an adhesive film for imprinting according to claim 1,
   wherein the solvent contains an organic solvent.

7. The composition for forming an adhesive film for imprinting according to claim 1,
   wherein the resin (A) is a (meth)acrylic resin.

8. The composition for forming an adhesive film for imprinting according to claim 1,
   wherein the alkylene group of the -alkylene group-oxygen atom-structure is an ethylene group.

9. The composition for forming an adhesive film for imprinting according to claim 1,
   wherein the number of repeating units of the -alkylene group-oxygen atom-structure is 4.5 to 90.

10. The composition for forming an adhesive film for imprinting according to claim 1, wherein the repeating unit derived from the polymerizable compound having a ClogP value less than or equal to 0 is represented by Formula (II) or Formula (III):

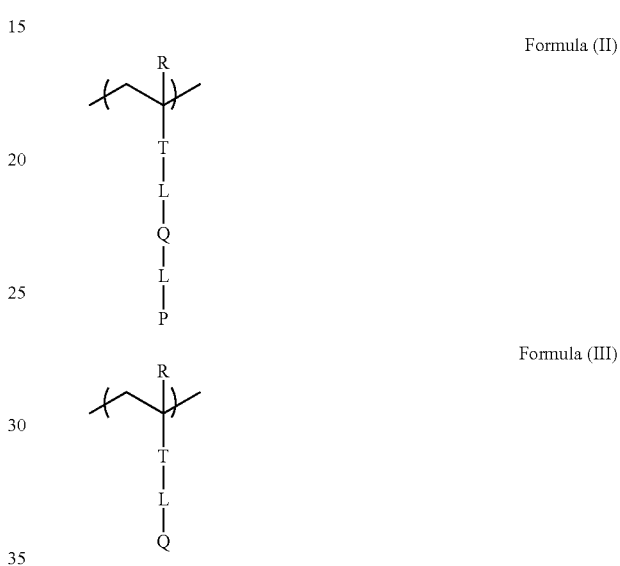

wherein in Formulae (II) to (III), each R independently represents a hydrogen atom, a methyl group, or a hydroxymethyl group, each T independently represents a single bond, *—C(=O)O—, or *—C(=O)NH—, bonding to a main chain is carried out on a * side, each L independently represents a single bond or a divalent linking group, P represents a polymerizable group, and Q is a divalent linking group or a monovalent linking group, both containing the -alkylene group-oxygen atom-structure.

11. The composition for forming an adhesive film for imprinting according to claim 1,
    wherein the repeating unit derived from the polymerizable compound having a ClogP value less than or equal to 0 is any of the following:

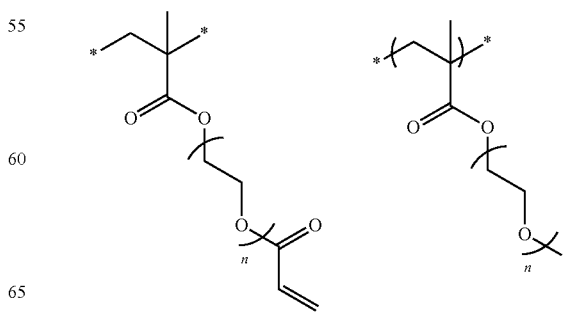

-continued

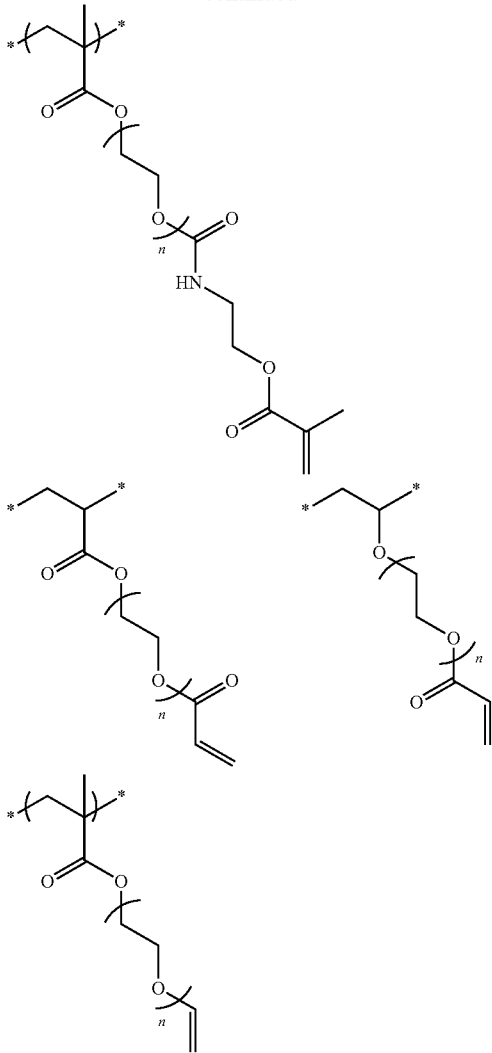

wherein in the first repeating unit above n represents 4.5, in the second repeating unit above n represents 90, in the third repeating unit above n represents 13.2, in the fourth and fifth repeating units above n represents 10, and in the sixth repeating unit above n represents 8.

12. An adhesive film formed from the composition for forming an adhesive film for imprinting according to claim 1.

13. The adhesive film according to claim 12, wherein a critical surface tension of the adhesive film is greater than or equal to 45 mN/m.

14. A laminate comprising:
a substrate; and
an adhesive film positioned on a surface of the substrate, wherein the adhesive film is the adhesive film according to claim 12.

15. The laminate according to claim 14, wherein the adhesive film interacts with the substrate by at least one selected from the group consisting of a covalent bond, an ionic bond, and a hydrogen bond.

16. The laminate according to claim 14, further comprising:
a layer formed from a curable composition for imprinting on a surface of the adhesive film in order of the substrate, the adhesive film, and the layer formed from the curable composition for imprinting.

17. The laminate according to claim 14, further comprising:
a cured product pattern formed from a curable composition for imprinting on a surface of the adhesive film in order of the substrate, the adhesive film, and the cured product pattern.

18. A method for producing a cured product pattern, the method comprising:
an adhesive film formation step of forming an adhesive film by applying the composition for forming an adhesive film for imprinting according to claim 1 onto a substrate;
an application step of applying a curable composition for imprinting onto a surface of the adhesive film;
a mold contact step of bringing the curable composition for imprinting into contact with a mold having a pattern for transferring a pattern shape;
a light irradiation step of irradiating the curable composition for imprinting with light to obtain a cured product; and
a release step of separating the cured product from the mold.

19. A method for manufacturing a circuit substrate, the method comprising:
a step of obtaining a cured product pattern through the production method according to claim 18.

* * * * *